(12) United States Patent
Ominami et al.

(10) Patent No.: US 9,508,527 B2
(45) Date of Patent: Nov. 29, 2016

(54) SAMPLE BASE, CHARGED PARTICLE BEAM DEVICE AND SAMPLE OBSERVATION METHOD

(71) Applicant: Hitachi High-Technologies Corporation, Minato-ku, Tokyo (JP)

(72) Inventors: Yusuke Ominami, Tokyo (JP); Takashi Ohshima, Tokyo (JP); Sukehiro Ito, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 14/646,159

(22) PCT Filed: Nov. 26, 2013

(86) PCT No.: PCT/JP2013/081793
§ 371 (c)(1),
(2) Date: May 20, 2015

(87) PCT Pub. No.: WO2014/081040
PCT Pub. Date: May 30, 2014

(65) Prior Publication Data
US 2015/0318143 A1 Nov. 5, 2015

(30) Foreign Application Priority Data
Nov. 26, 2012 (JP) .................................. 2012-257030

(51) Int. Cl.
*H01J 37/26* (2006.01)
*H01J 37/16* (2006.01)
(Continued)

(52) U.S. Cl.
CPC ................ *H01J 37/16* (2013.01); *H01J 37/18* (2013.01); *H01J 37/20* (2013.01); *H01J 37/228* (2013.01); *H01J 37/244* (2013.01); *H01J 37/28* (2013.01);
(Continued)

(58) Field of Classification Search
USPC ........... 250/306, 307, 309, 310, 311, 440.11, 250/441.11, 442.11, 443.1
See application file for complete search history.

(56) References Cited

U.S. PATENT DOCUMENTS

| | | |
|---|---|---|
| 5,412,210 A | 5/1995 | Todokoro et al. |
| 5,594,245 A | 1/1997 | Todokoro et al. |

(Continued)

FOREIGN PATENT DOCUMENTS

| | | |
|---|---|---|
| JP | 5-290786 A | 11/1993 |
| JP | 10-283978 A | 10/1998 |

(Continued)

OTHER PUBLICATIONS

International Search Report (PCT/ISA/210) dated Feb. 10, 2014 with English translation (three pages).
(Continued)

*Primary Examiner* — Nicole Ippolito
(74) *Attorney, Agent, or Firm* — Crowell & Moring LLP

(57) ABSTRACT

This charged particle beam device irradiates a primary charged particle beam generated from a charged particle microscope onto a sample arranged on a light-emitting member that makes up at least a part of a sample base, and, in addition to obtaining charged particle microscope images by the light-emitting member detecting charged particles transmitted through or scattered inside the sample, obtains optical microscope images by means of an optical microscope while the sample is still arranged on the sample platform.

17 Claims, 18 Drawing Sheets

(51) Int. Cl.
  *H01J 37/28* (2006.01)
  *H01J 37/20* (2006.01)
  *H01J 37/244* (2006.01)
  *H01J 37/22* (2006.01)
  *H01J 37/18* (2006.01)

(52) U.S. Cl.
  CPC ... *H01J 2237/201* (2013.01); *H01J 2237/2003* (2013.01); *H01J 2237/2004* (2013.01); *H01J 2237/2006* (2013.01); *H01J 2237/2007* (2013.01); *H01J 2237/20235* (2013.01); *H01J 2237/2445* (2013.01); *H01J 2237/24455* (2013.01); *H01J 2237/24475* (2013.01); *H01J 2237/2608* (2013.01); *H01J 2237/2801* (2013.01)

(56) References Cited

U.S. PATENT DOCUMENTS

| | | |
|---|---|---|
| 5,866,904 A | 2/1999 | Todokoro et al. |
| 5,969,357 A | 10/1999 | Todokoro et al. |
| 6,114,695 A | 9/2000 | Todokoro et al. |
| 2011/0079712 A1 | 4/2011 | Kawata et al. |
| 2012/0193530 A1* | 8/2012 | Parker et al. ...... G01N 21/6428 250/307 |
| 2014/0123898 A1 | 5/2014 | Nomaguchi et al. |

FOREIGN PATENT DOCUMENTS

| | | |
|---|---|---|
| JP | 2013-20918 A | 1/2013 |
| WO | WO 90/03844 A1 | 4/1990 |

OTHER PUBLICATIONS

Japanese-language Written Opinion (PCT/ISA/237) dated Feb. 10, 2014 (three pages).

Y. Wang et al., "Transparent Garnet Ceramic Scintillators for Gamma-ray Detection," Optomechatronic Micro/Nano Devices and Components III, Oct. 10, 2007, pp. 850717-1-850717-8, vol. 8507, Lausanne, Switzerland, XP055226988.

Extended European Search Report issued in counterpart European Application No. 13857331.6 dated Jul. 4, 2016 (nine (9) pages).

* cited by examiner

SAMPLE BASE, CHARGED PARTICLE BEAM DEVICE AND SAMPLE OBSERVATION METHOD

TECHNICAL FIELD

The present invention relates to a charged particle beam device capable of observing an inside of a sample, and a sample base for the same.

BACKGROUND ART

In order to observe an internal structure in a very small area of an object, a scanning transmission electron microscope (STEM), a transmission electron microscope (TEM), or the like is used. As a general observation method for observing the inside of the sample by using such an electron microscope, it has been known to place the sample, which is sliced thinly such that an electron beam can transmit therethrough, on a mesh sample base including a large number of holes, so as to obtain a transmission electron beam by a detector which is disposed opposite to an electron source side with respect to a sample surface. However, since the sample is configured to float over mesh holes in this method, an operation for mounting the sample on the sample base is extremely difficult. Therefore, in Patent Document 1, an electron detector which can be directly mounted with a sample for observation has been proposed.

Further, the very small area of the object can be observed not only by the electron microscope but also by an optical microscope. By using the optical microscope, it is possible to obtain color information which cannot be obtained in principle by the electron microscope. In the optical microscope, it is possible to obtain a transmitted optical image by irradiating a white light or a specific light from one surface side of the sample, and by imaging light having the color information emitted from the sample or absorbed in the sample by an optical system on the other surface side of the sample. Thus, for example, it is possible to stain only a specific area in a cell by adding a specific stain to a biological cell sample or the like, thereby observing which area is stained or not by observing the color. In particular, since the transmitted optical image has a higher resolution than that of a reflected optical image, it is widely used in fields of life science and pathological diagnosis.

While the color information cannot be obtained by the electron microscope, the electron microscope can observe with high resolution the very small area which cannot be observed by the optical microscope. Further, information obtained from an electron microscope image is information reflecting a density difference of the sample, and is different from information obtained by the optical microscope.

CITATION LIST

Patent Literature

{Patent Document 1}
Japanese Patent Application Publication No. H10-283978

SUMMARY OF INVENTION

Technical Problem

As described above, since there are differences in information to be obtained between the electron microscope and the optical microscope, there has been recently very increased a demand for observing the same sample by both the electron microscope and the optical microscope. However, the detector and sample base in Patent Document 1 cannot transmit light therethrough, and is a sample base for the electron microscope which has substantially no ability of observation by the optical microscope. Therefore, a sample for the electron microscope and a sample for the optical microscope must be prepared separately, and there have been problems, for example, that it takes time for sample preparations.

The present invention has been made in view of such problems, and an object of the present invention is to provide a sample base, a charged particle beam device and a sample observation method, which are capable of both observation by transmitted charged particles and observation by a conventionally general optical microscope by use of one sample.

Solution to Problem

In order to solve the above problems, the present invention is characterized in that a sample is placed directly or via a predetermined member on a light-emitting member, which forms at least a portion of a sample base and emits light by charged particles transmitted through or scattered inside the sample, and an optical microscope image and a transmission charged particle microscope image of the sample are obtained by using a sample base in which infrared light, ultraviolet light, or visible light of a specific wavelength or all wavelength ranges can pass through at least between a portion on which the sample is placed and a surface opposite to the portion on which the sample is placed in the sample base.

Further, the present invention is characterized in that a charged particle microscope image is obtained by irradiating a charged particle beam to the sample placed on the light-emitting member, which forms at least a portion of the sample base and emits light by charged particles transmitted through or scattered inside the sample, and by detecting emitted light from the light-emitting member, and the optical microscope image is obtained by an optical microscope while the sample is placed on the sample base.

Advantageous Effects of Invention

According to the present invention, it is possible to provide a sample base, a charged particle beam device and a sample observation method, which are capable of both observation by transmitted charged particles and observation by a conventionally general optical microscope by use of one sample.

Problems, configurations and effects other than those described above will be apparent from the following description of embodiments.

DESCRIPTION OF EMBODIMENTS

Hereinafter, each embodiment of the present invention will be described with reference to the accompanying drawings.

In the followings, details of a sample base in the present invention and a charged particle beam device employed with the sample base will be described. However, this is merely an example of the present invention, and the present invention is not limited to the embodiments described below. The present invention can be also applied to a scanning electron microscope, a scanning ion microscope, a scanning transmission electron microscope, a composite device of a sample processing device and these microscopes, or an analysis/inspection device employed with these microscopes.

In this specification, the term "atmospheric pressure" means an air atmosphere or a predetermined gas atmosphere, and a pressure environment of atmospheric pressure or in a state of slightly negative pressure. Specifically, it is about $10^5$ Pa (atmospheric pressure) to $10^3$ Pa.

Embodiment 1

Overview

Figure 1:
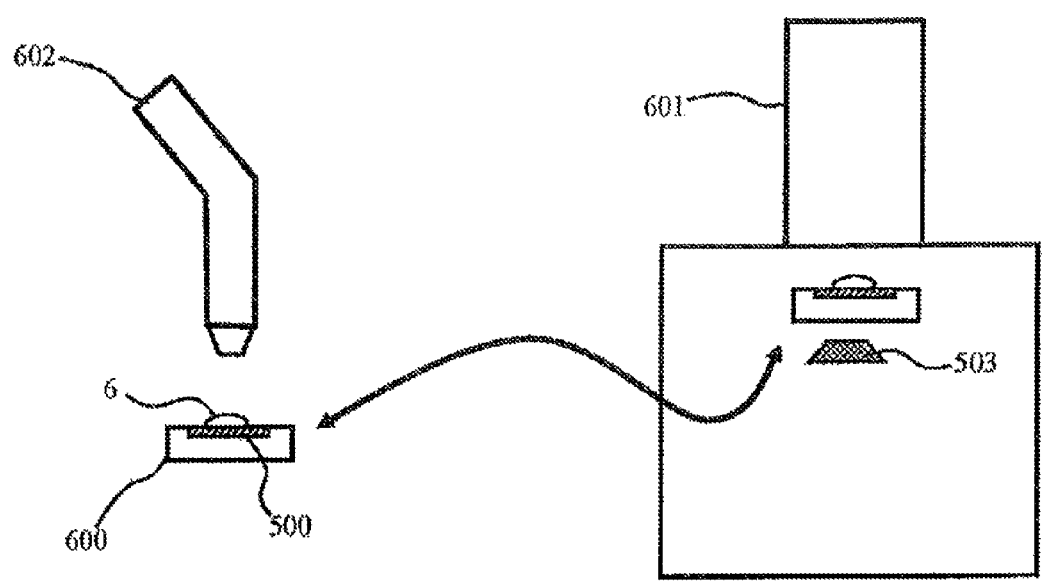
FIG. 1 is a schematic explanatory diagram of optical microscope observation and charged particle microscope observation.

First, an overview of the present embodiment will be described with reference to FIG. 1. FIG. 1 shows a sample base 600 including a detection element 500 (also referred to as a light-emitting member) capable of converting or amplifying charged particles to light to be emitted, a charged particle microscope 601, and an optical microscope 602 in the present embodiment. A sample 6 can be mounted on the sample base 600.

The detection element included in the sample base is made of a transparent member. Hereinafter, in this specification, the term "transparent" means that infrared light, ultraviolet light, or visible light of a specific wavelength range can pass therethrough, or infrared light, ultraviolet light, or visible light of all wavelength ranges can pass therethrough. The wavelength range is a range of about 380 nm to 750 nm. For example, when the member is transparent even if it is mixed with some colors, it means that visible light of a specific wavelength can pass therethrough, and when the member is colorless and transparent, it means that visible light of all wavelength ranges can pass therethrough. Here, the term "can pass therethrough" means that a light, which has light intensity capable of performing optical microscope observation by means of at least a light of the wavelength range, passes therethrough (for example, it is desirable that transmission factor is equal to or greater than 50%). Further, a specific wavelength range is a wavelength range including at least a wavelength range used for observation by the optical microscope. Therefore, a "optical transmission signal" obtained by light transmitting through the sample from one surface side of the sample base of the present embodiment can be used by a general optical microscope (transmission optical microscope) capable of detecting the signal from the other surface side of the sample base. As the optical microscope, any microscope using light, such as a biological microscope, a stereo microscope, an inverted microscope, a metallurgical microscope, a fluorescence microscope, and a laser microscope, may be employed. Further, the term "microscope" is used for description here, but the present invention is applicable to a device in general for obtaining information by irradiating the sample with light, regardless of an enlargement ratio of an image.

In the present embodiment, it is also possible to obtain a transmission charged particle microscope image by detecting a "charged particle transmission signal" by the detection element included in the sample base, the "charged panicle transmission signal" being transmitted through or scattered inside the sample after the sample 6 is irradiated with a charged particle beam generated in the charged particle microscope. As described below, in order to convert and amplify light from the detection element 500 to an electrical signal, a photodetector 503 is included in the charged particle microscope 601.

Since the sample base of the present embodiment can be mounted on a charged particle microscope device such as an electron microscope, it can be a common sample base used in common with the optical microscope. In other words, as shown by an arrow in FIG. 1, by observing the same sample base while being moved between each microscope, both optical observation and charged particle observation are possible while the sample is placed on a sample base, without transferring the sample or preparing a plurality of samples for each microscope observation. Note that, the same sample base may be mounted on each microscope arranged separately as shown in FIG. 1, or a compound microscope device, in which the optical microscope and the charged particle microscope are integrated together, may be used as described below. In the followings, details of the sample base, sample mounting method, image obtaining principle, device configuration, and the like will be described.

<Description of Sample Base>

Details of the sample base in the present invention will be described with reference to FIG. 2. The sample base of the present invention is composed of a transparent detection element 500 for converting the charged particle beam to light, and a transparent member 501 (also referred to as a base) for supporting the detection element 500. The sample 6 is mounted directly on the detection element 500. Or, the sample 6 may be mounted indirectly via a member such as a film as described below. The transparent member 501 is ideally colorless and transparent, but may be mixed with some colors. As the transparent member 501, there is a transparent glass, a transparent plastic, a transparent crystalline body, or the like. When observing the sample by a fluorescence microscope or the like, the plastic is suitable because fluorescence had better not be absorbed thereby. In the sample base of the present embodiment, it is sufficient that at least the transparent member and the detection element, which are between a portion on which the sample is placed and a surface opposite to the portion on which the sample is placed in the sample base, are "transparent".

The detection element 500 is an element which detects the charged particle beam coming flying with an energy of several keV to several tens keV, and emits lights such as infrared light, ultraviolet light, and visible light when being irradiated with the charged particle beam. The detection element is, for example, a scintillator, a luminescent material, a YAG (yttrium aluminum garnet) element, a YAP (yttrium aluminum perovskite) element, or the like. Any material may be employed as the detection element 500, if it is an element capable of converting the charged particle beam to light. Note that, the detection element may not be a detachable solid, but may be a fine particle or a thin film coated with a fluorescent agent for generating fluorescence by being irradiated with the charged particle beam. In the present embodiment, members including these for generating light by receiving charged particles on a light receiving surface thereof are collectively referred to as a light-emitting member. A mean free path in solid of the charged particle beam is several tens nm to several tens μm, although it depends on an acceleration voltage of the charged particle beam. Therefore, a light-emitting area of an upper surface of the detection element 500 is also an area of thickness comparable to the mean free path from a surface of the detection element. Therefore, it is sufficient that a thickness of the detection element 500 exceeds this thickness. On the other hand, it is better that the detection element 500 is as thin as possible in case of a detection element mixed with some colors, because it is necessary that the optical transmission signal can transmit therethrough as much as possible when observing the sample by the optical microscope as described above.

As the sample base which is often used in the optical microscope, there are transparent sample bases such as a glass slide (or prepared slide) or dish (or petri dish). That is, when the sample base in the present embodiment including the detection element capable of converting the charged particle beam to light is made to have a shape of a general glass slide (for example, about 25 mm×about 75 mm×about 1.2 mm) for these optical microscopes, the sample mounting and sample observation can be performed with a feeling or experience of using the glass slide. Therefore, after a sample is selected by primary screening by the optical microscope, it is possible to use the sample as it is, for detailed observation by the charged particle microscope. Or, since it takes a lot of effort to prepare a sample for a general high performance transmission charged particle microscope device, sample observation by using the sample base in the present invention can be a sample screening before observation by the high performance transmission charged particle microscope. Further, a sample mounting device, a case of glass slide for the optical microscope and the like, which optical microscope users have, can be utilized as they are. FIG. 2 shows a shape like a cross-sectional view of the glass slide, however, the sample base may be a shape of a dish (or petri dish) as shown in FIGS. 3A, 3B. FIG. 3A is a cross-sectional view, and FIG. 3B is an arrow view. Since the sample base in FIGS. 3A, 3B has a side wall 504 in a peripheral edge portion of a portion on which the sample is placed, as compared to FIG. 2, there is no possibility that the sample such as liquid leaks out therefrom.

Figure 2:
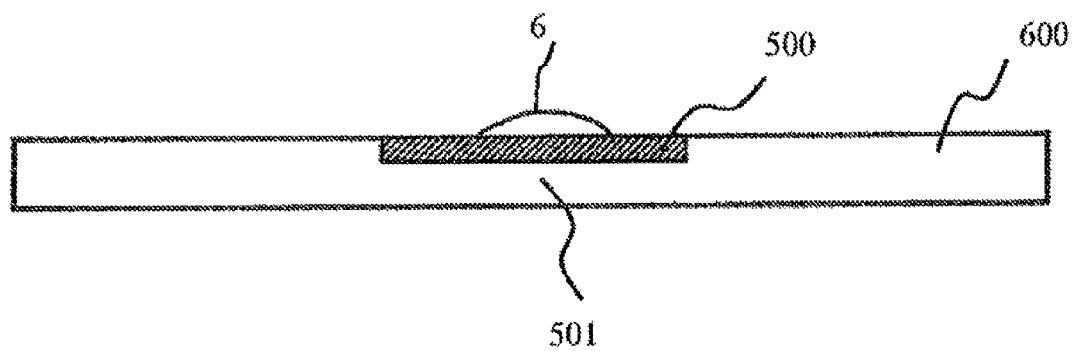
FIG. 2 is a detailed diagram of a sample base including a detection element.
Figure 3A:
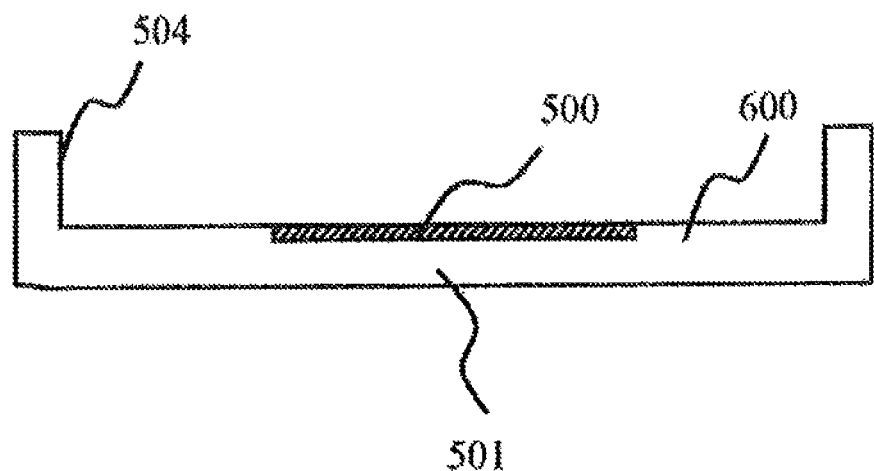
FIG. 3A is a detailed diagram of the sample base including the detection element.
Figure 3B:
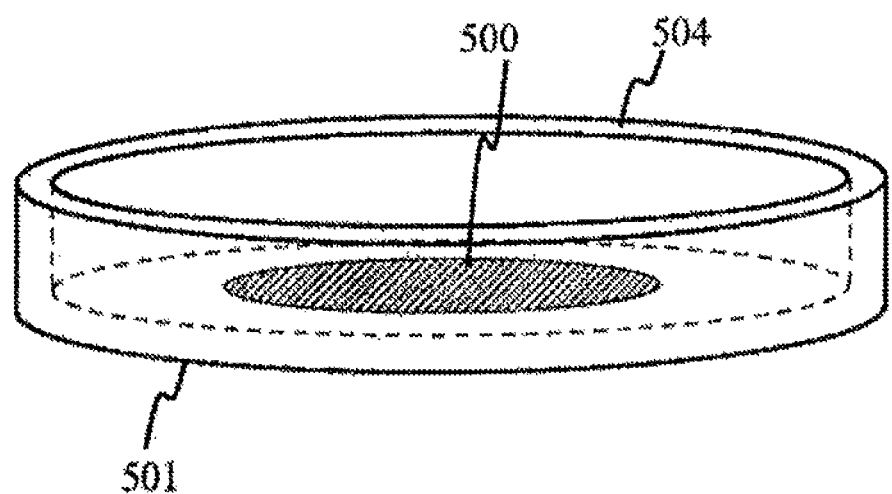
FIG. 3B is a detailed diagram of the sample base including the detection element.
Figure 4A:
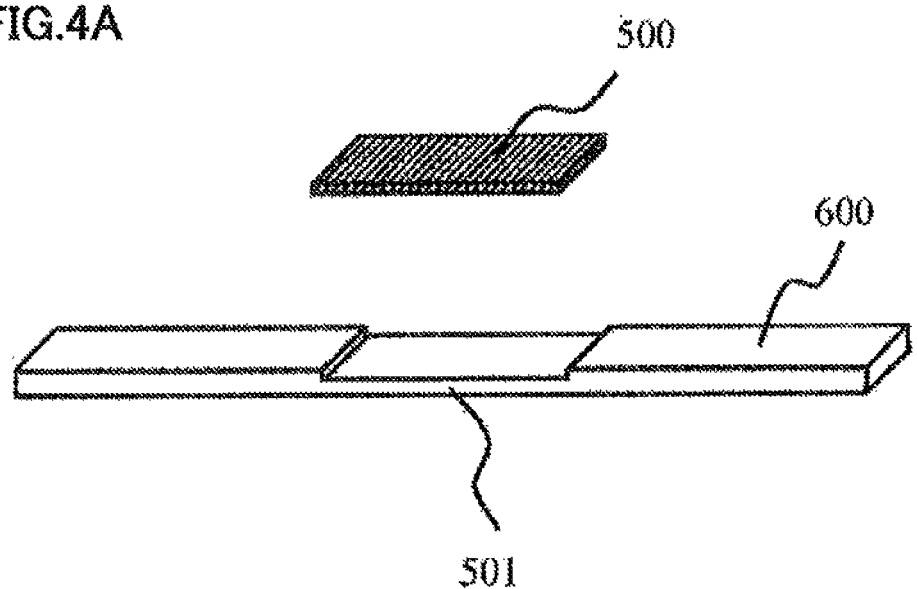
FIG. 4A is a detailed diagram of the sample base including the detection element.
Figure 4B:
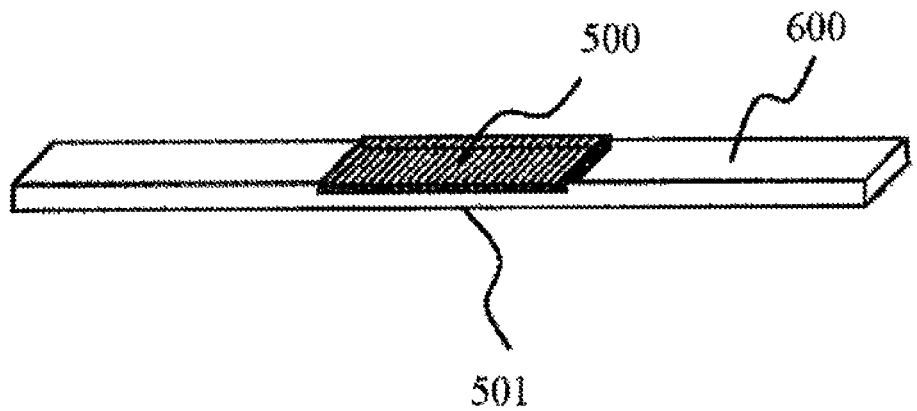
FIG. 4B is a detailed diagram of the sample base including the detection element.

FIGS. 2, 3A, 3B show that the upper surface of the detection element 500 and an upper surface of the transparent member 501 are flush with each other. In order to allow the optical microscope users to mount the sample with the same feeling or experience when they have used the glass slide or the petri dish in the past, it is desirable that there is not much unevenness between the detection element 500 and the transparent member 501 by matching heights of the upper surface (portion on which the sample is placed) of the detection element 500 and the upper surface of the transparent member 501 in this manner. FIGS. 4A, 4B show an example of the sample base in which the upper surface of the detection element 500 and the upper surface of the transparent member 501 are flush with each other. As a manufacturing method, the detection element 500 and the transparent member 501 can be manufactured separately, and then the detection element 500 can be fitted in a recessed portion formed in the transparent member 501 made of transparent material such as glass or plastic. In a case where either one is convex relative to the other, optically flat grinding such as polishing may be performed. The detection element 500 and the transparent member 501 are fixed to each other by an adhesive, a double-sided tape, mechanical fitting, or the like. Or, they may be joined by a chemical bond. Or, after manufacturing the sample base embedded with the detection element from the beginning, the sample base may be optically polished until the detection element is exposed to the surface of the sample base.

Figure 5A:
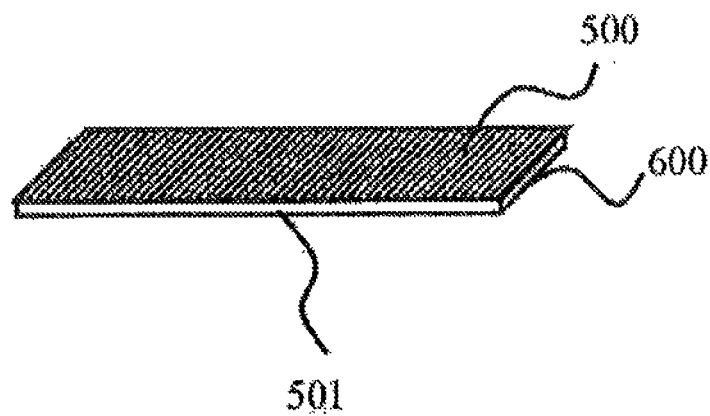
FIG. 5A is a detailed diagram of the sample base including the detection element.
Figure 5B:
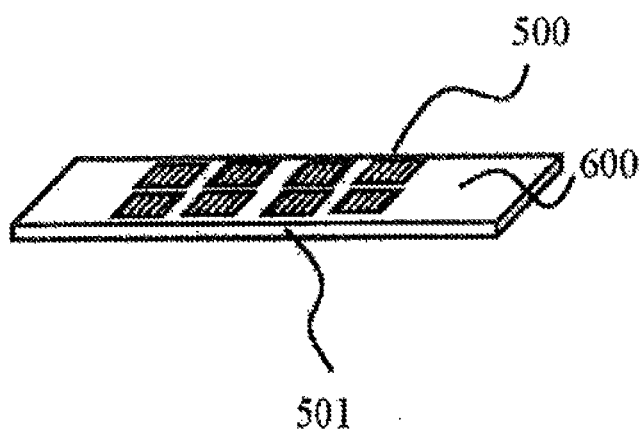
FIG. 5B is a detailed diagram of the sample base including the detection element.

In a case where a very large detection element can be used, an entire surface of the sample base may be the detection element as shown in FIG. 5A. That is, the detection element itself may be used as the sample base, or an entire area of a surface side on which the sample is placed of the transparent member may be the light-emitting member. In this case, it is possible to obtain the transmission signal by the charged particle beam, wherever the sample is placed on the sample base. Further, as another embodiment, a plurality of detection elements may be placed on the transparent member as shown in FIG. 5B. In this manner, for example, in a case where there are a plurality of samples, it is possible to easily understand, for example, where is each sample on each position of the detection elements.

Figure 6A:
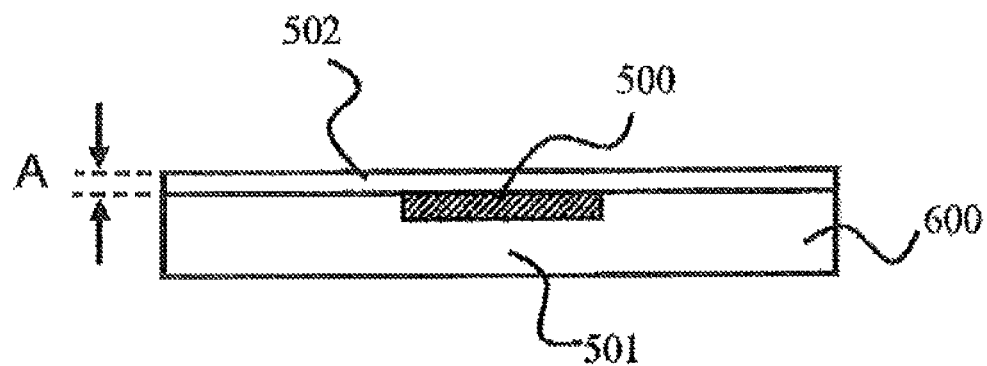
FIG. 6A is a detailed diagram of the sample base including the detection element.
Figure 6B:
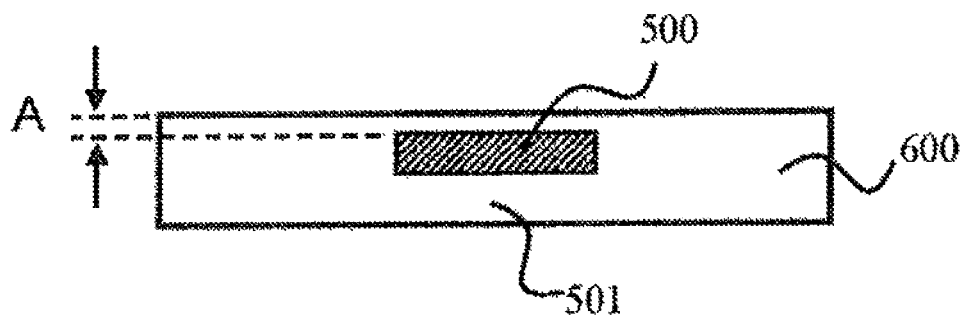
FIG. 6B is a detailed diagram of the sample base including the detection element.

As described above, the mean free path in solid of the charged particle beam is several tens nm to several tens μm, although it depends on the acceleration voltage of the charged particle beam. Therefore, a film 502 having a thickness sufficiently thinner than the mean free path may be placed between the sample and the detection element 500. In other words, the sample is placed on the thin film 502 which covers the detection element 500. This sample base is shown in FIG. 6A. The thickness of the film 502 is indicated by A in FIG. 6A. The thin film 502 needs to be transparent to the light and the charged particle beam. In other words, the film 502 needs to have a quality and thickness through which at least a part of the charged particle beam can transmit. By placing such a thin film 502, it is possible to prevent dirt, scratches and the like on the surface of the detection member 500. However, in a case where the thin film 502 is an insulator, the film 502 is charged when the detection element 500 is irradiated with the charged particle beam in vacuum, and it is difficult to observe the sample in some cases. Therefore, by using a conductive member as the thin film 502 in FIG. 6A, it is also possible to remove the charge. Further, as shown in FIG. 6B, the transparent member 501 and the thin film 502 may be integrally formed to be one member. That is, after manufacturing the transparent member 501 embedded with the detection element 500 therein, it is possible to manufacture the sample base in FIG. 6B by optically polishing the sample base until a distance between the upper surface of the detection element 500 and the upper surface of the transparent member 501 becomes A. Since the sample base in FIG. 6B includes a small number of members as compared to the sample base in FIG. 6A, it is possible to prevent dirt, scratches and the like on the surface of the detection member 500 at a low cost.

Figure 7A:
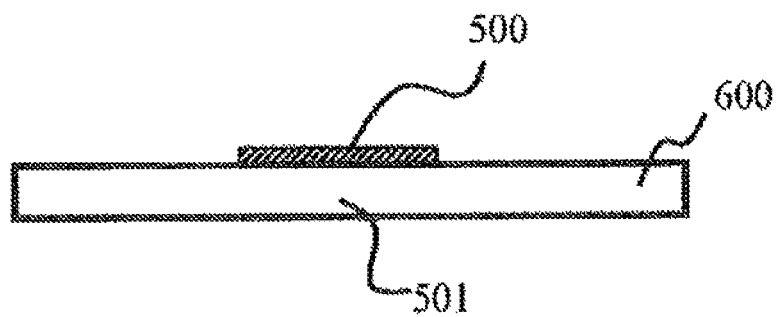
FIG. 7A is a detailed diagram of the sample base including the detection element.
Figure 7B:
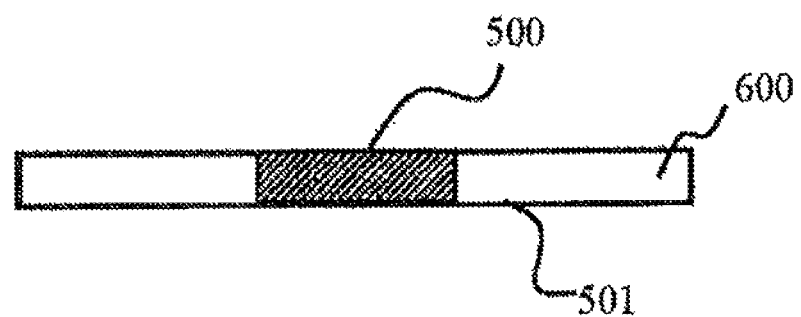
FIG. 7B is a detailed diagram of the sample base including the detection element.

Further, the detection element 500 may be slightly convex from the surface of the sample base 600 as shown in FIG. 7A, in a case where the users can mount the sample with a feeling or experience of using the sample in the past. For example, the sample base can be manufactured by attaching the detection element 500 having a thickness of several hundred pun or less on the transparent member 501. In this case, since the transparent member 501 has a very simple shape and the detection element 500 has a small area, it is possible to manufacture the sample base at a low cost. Further, in a case where the detection element 500 itself can be obtained or manufactured at a low cost, the sample base may have a shape in which thicknesses of the transparent member and the detection element are equal to each other, and the detection element 500 is formed from the upper surface to the lower surface of the sample base, as shown in FIG. 7B. In this case, the transparent member 501 serves as a base for supporting the detection element 500. Or, although not shown, in a case where the detection element 500 can be manufactured at a very low cost, the entire sample base 600 may be the detection element 500. In other words, the transparent member 501 becomes the detection element 500.

Figure 8A:
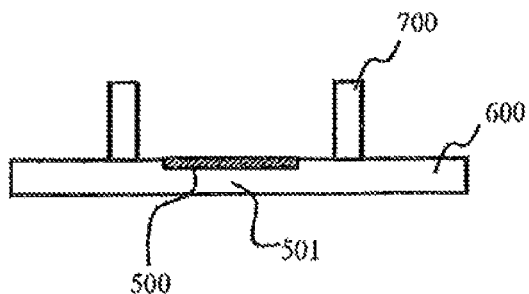
FIG. 8A is a detailed diagram of the sample base including the detection element.
Figure 8B:
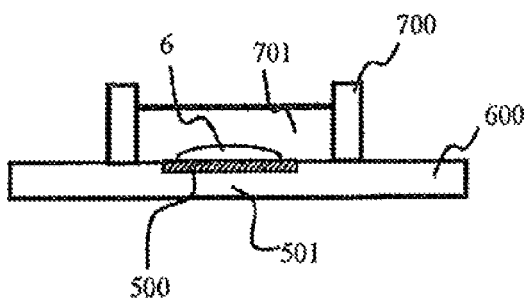
FIG. 8B is a detailed diagram of the sample base including the detection element.
Figure 8C:
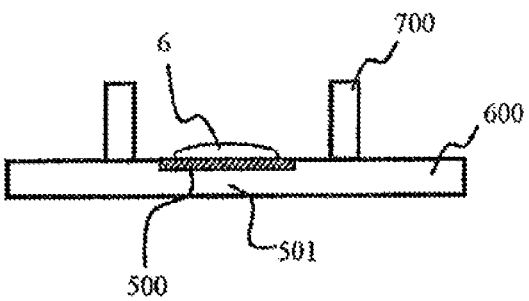
FIG. 8C is a detailed diagram of the sample base including the detection element.
Figure 8D:
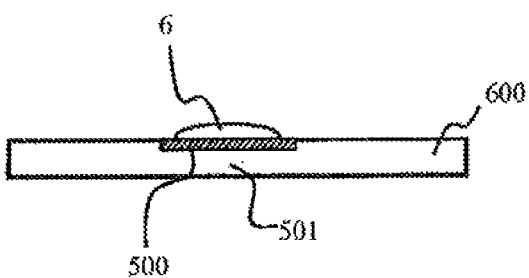
FIG. 8D is a detailed diagram of the sample base including the detection element.

As shown in FIGS. 8A, 8B, 8C, 8D, the sample base of the present embodiment can be integrated with a culture vessel. A vessel 700 is arranged on the sample base 600 (FIG. 8A). The vessel 700 is, for example, a cylindrical member having openings on the upper side and lower side. Next, the sample 6 such as a cell and a culture medium 701 such as a culture solution are mounted inside the vessel 700 (FIG. 8B). Note that, the sample base may include a leakage preventing member such as a rubber or packing, so that the culture medium 701 does not leak from between the sample base 600 and the vessel 700. After culturing the sample, the culture medium 701 such as a culture solution is removed (FIG. 8C). After that, by removing the vessel 700 from the sample base 600, it is possible to make a state in which the sample 6 adheres to the detection element 500 (FIG. 8D). In the drawings, the detection element 500 and the vessel 700 are respectively illustrated only one, however, they may be plurally arranged on one sample base. Note that, the sample needs to be thin so that the charged particle beam and light can transmit therethrough. For example, the sample has a thickness of about several tens nm to several tens μm. Therefore, it is necessary that the cell cultured as described above has approximately the above-mentioned thickness after being cultured. As the cultured cell, there is a nerve cell, a blood cell, an iPS cell, or the like, which has been cultured. Or, they may be bacteria or viruses. By using such a method, the optical microscope image and the transmission charged particle microscope image of the cell sample cultured on the sample base 600 can be obtained while the sample is mounted on the sample base 600.

The sample base 600 can be used not only in the charged particle microscope but also in the optical microscope, and as described below, the sample on the sample base can also be observed by an inverted optical microscope provided with an objective lens 251 on the opposite side of a surface on which the sample is mounted. In such a case, there is a case where it is desirable that the objective lens 251 of the optical microscope is close as much as possible to the sample. When a distance between the sample 6 and the objective lens 251 is L, there is a case where it is desirable that L is about several hundred μm or less.

Figure 9A:
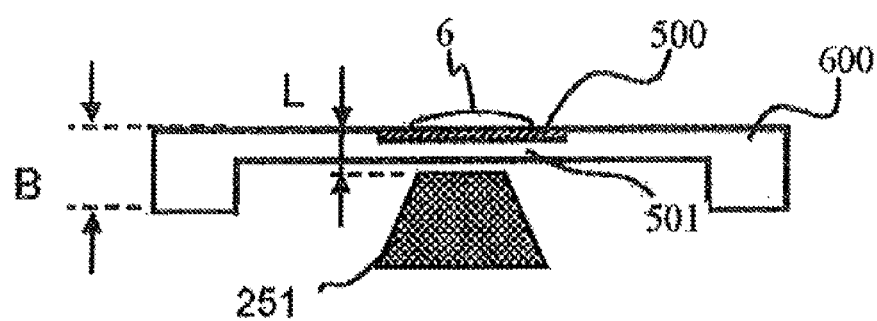
FIG. 9A is a detailed diagram of the sample base including the detection element.
Figure 9B:
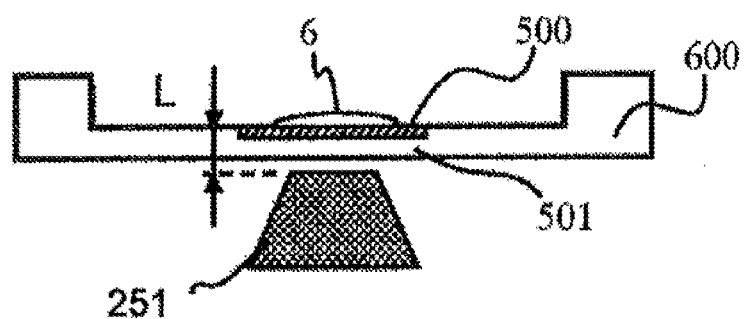
FIG. 9B is a detailed diagram of the sample base including the detection element.

It is considered to reduce the thickness of the entire sample base 600 including the detection element 500 to L or less, however, the sample base 600 itself is too thin and its strength is weak in some cases. Therefore, the transparent member of a portion on which the sample is mounted of the sample base may be thinner than the other portion thereof. That is, as shown in FIG. 9A, by making an area where a thickness of the detection element 500 and the portion on which the sample is mounted is thinner than a thickness (B portion in FIG. 9A) of the sample base 600, it is possible to allow the distance between the sample 6 and the objective lens 251 to be L. In this manner, the strength of the sample base 600 itself can be high, because both ends of the sample base are thick. Further, in a case where the sample can be mounted with user's feeling or experience in the past, an area where both ends of the sample base are thick may be on the opposite side as shown in FIG. 9B, or there may be thick areas on both upper and lower sides of the surface on which the sample is mounted.

Further, as described above, the detection element 500 may be the fine particle or the thin film coated with the fluorescent agent for generating fluorescence by being irradiated with the charged particle beam. As a manufacturing method, for example, it is possible to adopt a method of dissolving the fluorescent agent in a solvent such as water, alcohol, or the like, and performing dip coating or spin coating on the prepared slide. Or, coating by a spray or the like may be performed.

In the dish (or petri dish) or the glass slide (prepared slide) which is often used in the optical microscope, there is a case where a substance for improving adhesion of the sample to the sample base is applied to the sample base so that the sample is not separated from the sample base. For example, in a case where the sample is a biological sample such as a cell, since a cell surface is in a negatively charged state by phosphoric acid lipid of lipid bilayer, the cell sample is sometimes prevented from being peeled off from the sample base by applying molecules (lysine, aminosilane, or the like) in a positively charged state to the sample base such as the glass slide. The sample base 600 or the detection element 500 may also be adhered with the molecules in a positively charged state. Further, the sample base may be applied with a material having hydrophilicity so that it is easy to mount a sample in a state of containing a large amount of liquid. Or, the sample base may be applied with a material such as collagen having high affinity with the biological sample so that it is easy to culture or mount a living cell or bacteria. Here, the term "application" is intended to broadly include methods such as spraying, dipping, and coating in which a coating material is adhered to the surface of the sample base.

Further, the sample base 600 may include a paper or seal portion on which letters, a number, a bar code, an illustration and the like, that is information about the sample 6, can be described. In this case, it is easy to manage the sample 6 mounted on the sample base.

<Description of Methods and Principles>

Figure 10:
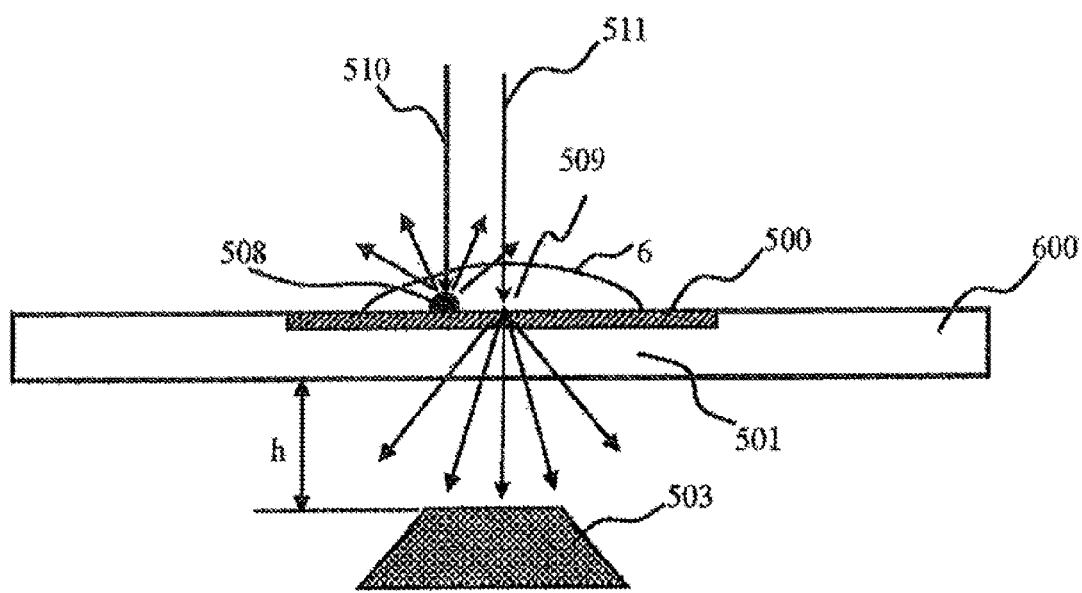
FIG. 10 is a diagram for describing detection of transmitted charged particles from the detection element.

In the followings, an optical detection method using the sample base of the present invention and a principle capable of obtaining a transmitted charged particle beam will be described. FIG. 10 shows a state in which the sample 6 is placed on the detection element 500. The photodetector 503 is illustrated under the sample base. The photodetector 503 can convert or amplify an optical signal from the detection element 500 to an electrical signal. The converted or amplified electrical signal is inputted into a computer and a control unit via a communication line, so that it is imaged by these control systems. The obtained image (transmitted charged particle beam image) may be displayed on a monitor or the like.

There may be a space (h portion in FIG. 10) between the sample base and the photodetector 503, however, the height h had better to be as short as possible in order to detect the light as efficiently as possible. The sample base and the photodetector 503 may be in contact with each other. Further, the light may be detected as efficiently as possible by increasing a light receiving area of the photodetector 503. Or, a light transmission path through which the light is transmitted efficiently may be provided in the h portion of the space between the sample base and the photodetector 503. Furthermore, in the drawing, the photodetector 503 is arranged under the sample base 600, but it may be arranged in a lateral direction or in the other directions as described below.

Here, it is assumed that there is a high density portion 508 and a low density portion 509 in the sample. When a primary charged particle beam 510 is irradiated on the high density portion 508 in the sample, the charged particle beam does not reach the detection element 500, because a large majority of the charged particle beam is backscattered. On the other hand, when a primary charged particle beam 511 is irradiated on the low density portion 509 in the sample, the charged particle beam can be transmitted to the detection element 500. As a result, it is possible to detect density differences inside the sample by the detection element 500. This transmission degree varies depending on acceleration energy of the charged particle beam. Therefore, it is also possible to change internal information to be observed and the area by changing the acceleration energy of the charged particle beam.

A method for mounting the sample on the sample base will be described below. The sample needs to be thin so that the charged particle beam and light can transmit therethrough. For example, the sample has the thickness of about several tens nm to several tens μm. As the sample which can be mounted directly on the detection element 500, for example, there are: a mucous membrane or liquid which contains cells; a liquid biological sample such as blood or urine; sectioned cells; particles in liquid; fine particles such as bacteria, fungi, or viruses, a soft material which contains fine particles, organic materials, or the like. As a method for mounting the sample, for example, the sample may be adhered to a tip of a cotton swab to be smeared on the detection element, or may be dropped on the detection element by a dropper. Further, in case of the fine particles, the sample may be sprinkled on the detection element. The sample may be coated on the sample base by the spray or the like, or a spin coating method of rotating the liquid at high speed and coating the liquid on the sample base may be used, or a dip coating method of coating the liquid on the sample base by dipping the sample base in the liquid and raising the sample base from the liquid may be used. In all cases, any method may be used as long as the thickness of the sample can be about several tens nm to several tens μm.

<Description During Charged Particle Beam Device Observation in Vacuum>

Figure 11:
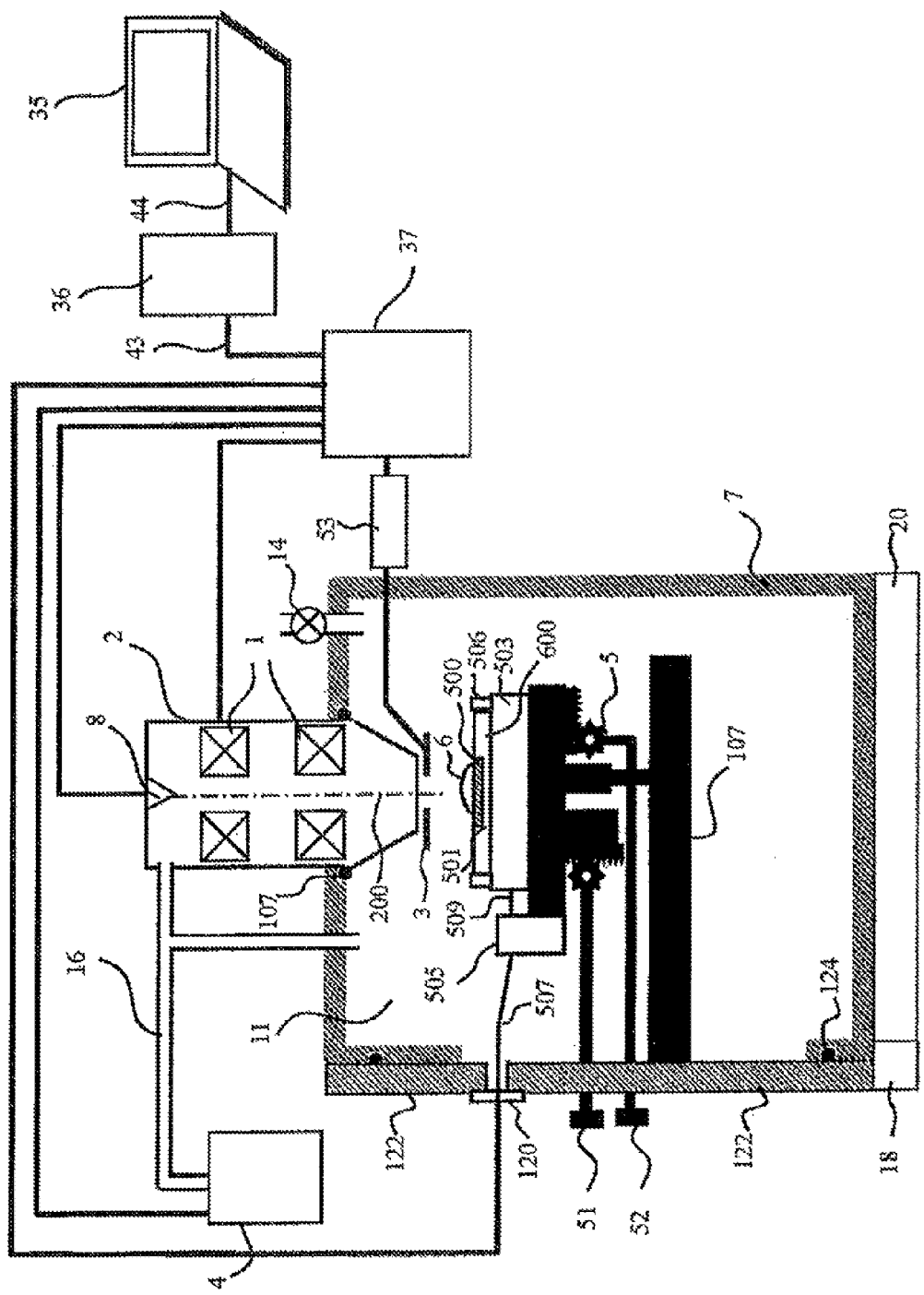
FIG. 11 is an overall configuration diagram for performing charged particle microscope observation in an embodiment 1.

Here, FIG. 11 shows a general charged particle beam device on which the sample base of the present embodiment is mounted. The charged particle microscope is mainly composed of a charged particle optical column 2, a casing 7 (hereinafter, also referred to as a vacuum chamber) for supporting the charged particle optical column 2 with respect to a device installation surface, and a control system for controlling these. During using the charged particle microscope, insides of the casing 7 and the charged particle optical column 2 are vacuum-evacuated by a vacuum pump 4. Start and stop operation of the vacuum pump 4 is also controlled by the control system. In the drawing, the vacuum pump 4 is shown only one, but there may be two or more.

The charged particle optical column 2 is composed of elements such as a charged particle source 8 for generating a primary charged particle beam, and optical lenses 1 for scanning the primary charged particle beam on the sample 6 by focusing the generated charged particle beam to lead it to a bottom of the column. The charged particle optical column 2 is arranged so as to project into the casing 7, and is fixed to the casing 7 via a vacuum seal member 123. At an end portion of the charged particle optical column 2, a detector 3 for detecting a secondary charged particle (secondary electron, reflected electron, or the like) obtained by irradiation of the primary charged particle beam is disposed. The detector 3 may not be at an illustrated position, or may be anywhere inside the casing 7.

By the charged particle beam which has reached the sample 6, the secondary charged particles such as reflected charged particles, transmitted charged particles and the like are emitted from a surface or an inside of the sample. The secondary charged particles are detected by the detector 3. The detector 3 is a detection element capable of detecting and amplifying the charged particle beam which comes flying with an energy of several keV to several tens keV. For example, the detection element is a semiconductor detector made of a semiconductor material such as a silicon, or a scintillator capable of converting a charged particle signal to light at a glass surface or an inside thereof.

The charged particle microscope of the present embodiment includes, as the control system, a computer 35 which is used by a device user, an upper control unit 36 which is connected to and communicates with the computer 35, and a lower control unit 37 which controls a vacuum evacuation system, a charged particle optical system and the like in accordance with an instruction transmitted from the upper control unit 36. The computer 35 includes a monitor for displaying an operation screen (a GUI) of the device, and an input means, such as a keyboard and mouse, to the operation screen. The upper control unit 36, the lower control unit 37 and the computer 35 are connected to each other respectively by communication lines 43, 44.

The lower control unit 37 is a portion which transmits and receives a control signal for controlling the vacuum pump 4, the charged particle source 8, the optical lens 1 and the like, and converts an output signal of the detector 3 to a digital image signal, to transmit the signal to the upper control unit 36. In the drawing, the output signal from the detector 3 is connected to the lower control unit 37 via an amplifier 53 such as a preamplifier. There may be no amplifier, if it is not necessary.

The upper control unit 36 and the lower control unit 37 may include a mixture of analog circuits, digital circuits and the like, and the upper control unit 36 and the lower control unit 37 may be integrated to one. Note that, a configuration of the control system shown in FIG. 11 is merely an example, and modified embodiments including the control unit, a valve, a vacuum pump, the communication line or the like, belong to a scope of the charged particle microscope of the present embodiment, as long as they fulfill functions intended in the present embodiment.

A vacuum pipe 16 connected to the vacuum pump 4 at one end thereof is connected to the casing 7, so that the inside of the casing 7 can be maintained in a state of vacuum. At the same time, the casing 7 includes a leak valve 14 for releasing the inside of the casing to the atmosphere, and it is possible to release the inside of the casing 7 to the atmosphere when the casing 7 is introduced into the device. There may be no leak valve 14, or may be two or more. Further, an arrangement position of the leak valve 14 in the casing 7 is not limited to the position shown in FIG. 11, and the leak valve 14 may be placed in another position on the casing 7.

The casing 7 includes an opening on a side surface thereof, and the inside of the device is maintained in vacuum-tight by means of a cover member 122 and a vacuum seal member 124 at the opening. The charged particle microscope of the present embodiment includes a sample stage 5 for changing a positional relationship between the charged particle optical column and the sample after putting the sample mounted on the sample base into the casing 7 as described above. The above-mentioned light-emitting member or the sample base having the light-emitting member is arranged detachably on the sample stage 5. A support plate 107 as a bottom plate is provided to be supported by the cover member 122, and the stage 5 is fixed to the support plate 107. The stage 5 includes an XY drive mechanism in the in-plane direction and a Z-axis drive mechanism in the height direction, and the like. The support plate 107 is provided so as to extend toward the inside of the casing 7 and toward a surface opposed to the cover member 122. Support shafts are respectively extended from the Z-axis drive mechanism and the XY drive mechanism, so as to be respectively connected to an operating knob 51 and an operating knob 52 included in the cover member 122. The device user can adjust the position of the sample by operating these operating knobs. Further, as described below, it may be configured such that the optical microscope can be provided on the cover member 122.

The sample base 600 including the detection element 500 can be mounted on the sample stage 5. As described above, the charged particle beam is converted to light in the detection element 500. The photodetector 503 for detecting this light, converting it to the electric signal, and amplifying the signal is provided on the sample stage 5 or in the vicinity of the stage. As described above, in order to efficiently detect the optical signal, this photodetector and the sample base including the detection element 500 may be close to each other or in contact with each other. Or, an optical transmission path may be arranged therebetween. In the drawing, the photodetector is provided on the sample stage, however, the photodetector 503 may be fixed to somewhere in the casing 7, or may be outside the casing 7. In a case where the photodetector 503 is outside the casing 7, the optical transmission path such as a glass, optical fiber or the like, for transmitting the light is in the vicinity of the sample base 500. By transmitting the optical signal, which has been converted in the detection element 500, through the optical transmission path, it is possible to detect the signal by the photodetector. The photodetector is, for example, a semiconductor detection element, a photomultiplier, or the like. In all cases, the photodetector of the present embodiment is intended to detect the light, which is emitted in the detection element of the sample base described above and passes through the transparent member.

The drawing shows how the photodetector 503 is provided on top of the stage 5. A preamplifier board 505 is connected via a wire 504 from the photodetector 503 provided in the stage 5. The preamplifier board 505 is connected to the lower control unit 37 via a wire 507 and the like. The preamplifier board 505 is inside the casing 7 in the drawing, but may be outside the casing 7. There is a projection 506 on the sample stage 5, and the sample base 600 is placed here. By the projection, the sample base 600 can be fixed to be prevented from displacement. Further, the sample base 600 may be fixed to the stage 5 with the double-sided tape or the like. However, since the sample base is used for the optical microscope as described above, it is not preferable to attach the double-sided tape to the lower surface of the sample base 600, but it is desirable that a displacement preventing member is attached to a side surface or elsewhere of the sample base 600 with the double-sided tape or the like. When the sample base 600 is mounted on the photodetector 503, since the photodetector 503 is arranged directly under the sample base 600, it is possible to efficiently detect the light which is transmitted through the sample 6 to be emitted in the detection element 500. With the devices and methods, it is possible to obtain a transmitted charged particle image using the charged particle beam device, as well as to observe the sample base with the optical microscope after taking out the sample base to the outside of the charged particle beam device, because the sample base of the present embodiment is formed of the transparent member.

Further, since the charged particle beam device of the present embodiment has both the detector 3 and the detection element 500, it is possible to obtain the secondary charged particle generated or reflected from the sample by the detector 3, as well as to obtain the transmitted charged particle scattered or transmitted through the sample by the detection element 500. Therefore, by using the lower control unit 37 and the like, it is possible to switch a display on a monitor 35 between a secondary charged particle beam image and the transmitted charged particle image. Further, it is also possible to display the two kinds of images at the same time.

<Description During Charged Particle Beam Device Observation at Atmospheric Pressure>

Figure 12:
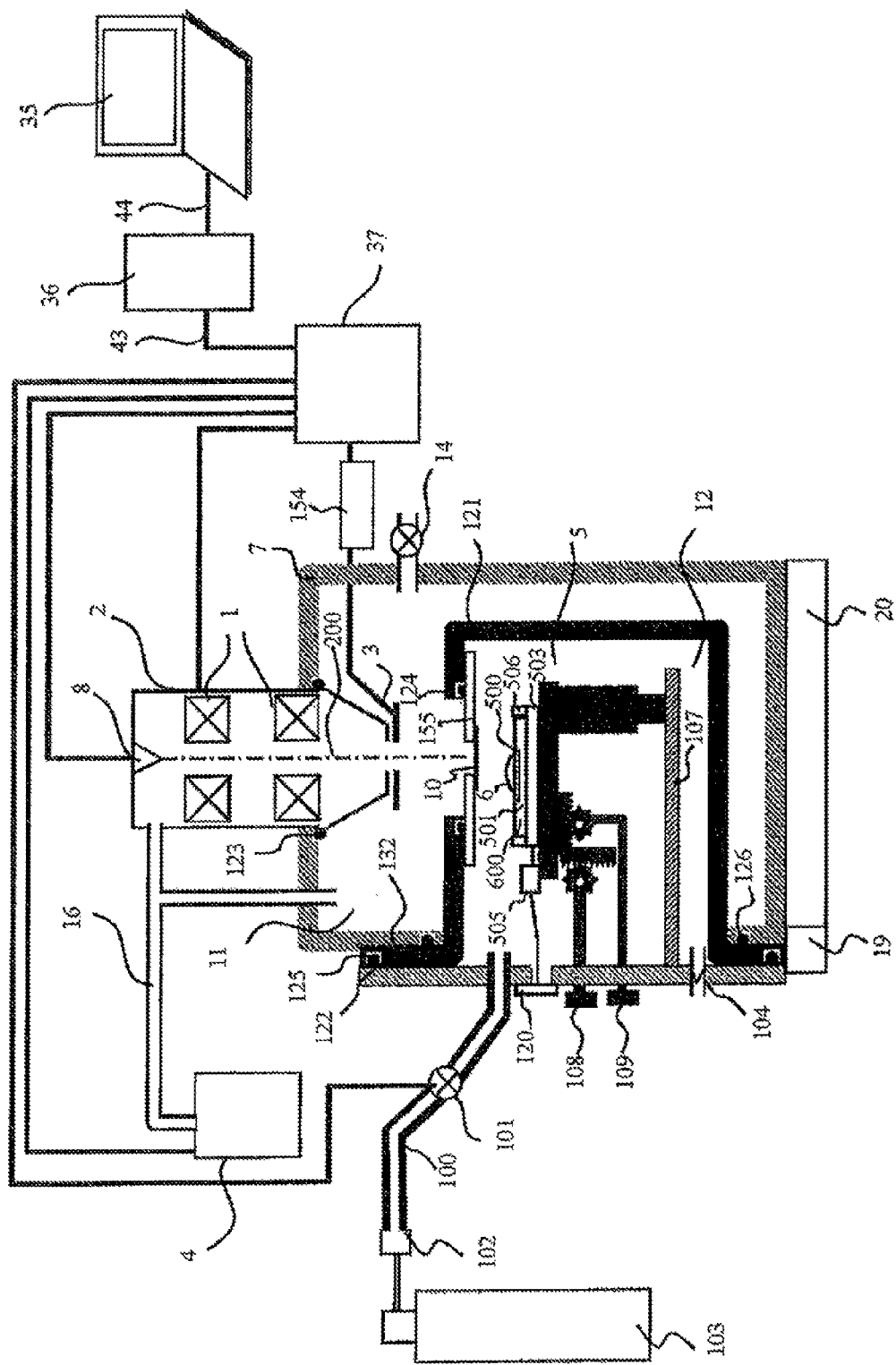
FIG. 12 is an overall configuration diagram for performing charged particle microscope observation in the embodiment 1.

Next, a configuration in which the present embodiment is applied to the charged particle beam device capable of observation at atmospheric pressure will be described with reference to FIG. 12. The charged particle beam device of the present embodiment is mainly composed of a charged particle optical column 2, a first casing (hereinafter, also referred to as a vacuum chamber) 7 for supporting the charged particle optical column 2 with respect to the device installation surface, a second casing (hereinafter, also referred to as an attachment) 121 which is used by being inserted into the first casing 7, a sample stage 5 arranged in the second casing 121, and a control system for controlling these. Since the basic configuration of the control system and the like are the same as FIG. 11, a detailed description thereof will be omitted.

At least one side surface among side surfaces of the second casing 121 of a rectangular parallelepiped shape is open. Surfaces other than a surface, on which a diaphragm holding member 155 is provided, among the side surfaces of the second casing 121 of the rectangular parallelepiped shape, are made of walls of the second casing 121. Or, the second casing 121 itself may not have a wall, and it may be made of side walls of the first casing 7 in a state of being incorporated in the first casing 7. The second casing 121 is inserted into the first casing 7 through the opening, and has a function of housing the sample 6 which is an observation object in the state of being incorporated in the first casing 7. The first casing 7 and the second casing 121 are fixed to an outer wall surface on the side of the side surface having the opening via a vacuum seal member 126. The second casing 121 may be fixed to any one of inner wall surfaces or side surfaces of the first casing 7, or the charged particle optical column. In this manner, the second casing 121 is fitted into the first casing 7. The opening is most easily prepared by utilizing an opening for loading/unloading the sample, which is originally included in a sample vacuum chamber of the charged particle microscope. That is, modification of the device is the requisite minimum by manufacturing the second casing 121 so as to be fitted to the size of a hole which is originally open, and by attaching the vacuum seal member 126 around the hole. Further, the second casing 121 can be removed from the first casing 7.

A side surface of the second casing 121 is an open surface which is in communication with an air space and has a size capable of at least loading and unloading of the sample, and the sample 6 housed inside the second casing 121 is placed in a state of atmospheric pressure, slightly negative pressure, or desired gas type during observation. Note that, FIG. 12 is a device sectional view in a direction parallel to an optical axis, and thus shows only one surface of the open surfaces, however, the open surface of the second casing 121 is not limited to one side as long as the second casing 121 is vacuum-sealed by the side surfaces of the first casing in the front direction and the rear direction of a paper surface of FIG. 12. It is sufficient that there is at least one or more open surfaces in a state where the second casing 121 is incorporated in the first casing 7. Through the open surface of the second casing, it is possible to load and unload the sample between the inside and outside of the second casing (attachment).

A diaphragm 10 through which the charged particle beam can transmit or pass is provided on an upper surface side of the second casing 121. The diaphragm 10 is detachable from the second casing 121. The vacuum pump 4 is connected to the first casing 7, so that it can vacuum-evacuate a closed space (hereinafter, referred to as a first space) formed by inner wall surfaces of the first casing 7, outer wall surfaces of the second casing, and the diaphragm 10. As a result, in the present embodiment, the first space 11 is maintained at high vacuum by the diaphragm 10, while a second space 12 is maintained in a gas atmosphere having atmospheric pressure or about the same pressure as atmospheric pressure. Therefore, during device operation, it is possible to maintain the charged particle optical column 2 side in a vacuum state, as well as to maintain the sample 6 and the sample base described above at atmospheric pressure or in an atmosphere having a predetermined pressure. The diaphragm 10 is held by the diaphragm holding member 155, and it is possible to change the diaphragm 10 by changing the diaphragm holding member 155.

In a case of the charged particle microscope of the present embodiment, the open surface forming at least one side surface of the second casing 121 can be covered with the cover member 122. The cover member 122 is provided with the sample stage and the like.

The charged particle microscope of the present embodiment has a function of supplying a replacement gas into the second casing 121 or a function capable of forming a pressure state different from the first space. The charged particle beam emitted from a lower end of the charged particle optical column 2 passes through the first space maintained at high vacuum, and passes through the diaphragm 10 shown in FIG. 12, and then enters the second space maintained at atmospheric pressure or slightly negative pressure. That is, the second space is in a state of lower degree of vacuum than the first space. Since the charged particle beam is scattered by gas molecules in the air space, the mean free path is shortened. That is, when a distance between the sample 6 and the diaphragm 10 is large, the primary charged particle beam, the secondary charged particle generated by irradiation of the primary charged particle beam, the reflected charged particle, or the transmitted charged particle does not reach the sample 6, the detector 3, or the detection element 500. On the other hand, scattering probability of the charged particle beam is proportional to the density and mass number of the gas molecules. Therefore, by replacing the second space with gas molecules having a smaller mass number than that of the air, or by vacuum-evacuating the second space slightly, the scattering probability of the charged particle beam is reduced, so that the charged particle beam can reach the sample. Further, it is sufficient that at least air in a passing path of the charged particle beam in the second space, that is, air in a space between the sample and diaphragm can be replaced with gas, without replacing the whole of the second space. As a type of replacement gas, effect of improving image S/N can be seen in case of gases lighter than air, however, the effect of improving image S/N is greater in case of hydrogen gas or helium gas having a mass smaller than another gases.

For the above reasons, in the charged particle microscope of the present embodiment, the cover member 122 is provided with a mounting portion (gas inlet) of a gas supply pipe 100. The gas supply pipe 100 is connected to a gas cylinder 103 through a connecting portion 102, so that the replacement gas is introduced into the second space 12. A gas control valve 101 is provided in the middle of the gas supply pipe 100, and it is possible to control flow rate of the replacement gas flowing in the pipe. Therefore, a signal line is extended to the lower control unit 37 from the gas control valve 101, so that the device user can control the flow rate of the replacement gas by the operation screen displayed on the monitor of the computer 35. Further, the gas control valve 101 may be manually operated to be opened or closed.

Since the replacement gas is a light element gas, it is easy to accumulate in the upper part of the second space 12, and it is difficult to replace the lower part with the gas. Therefore, an opening through which the inside and outside of the second space are in communication with each other is provided in a position lower than the mounting portion of the gas supply pipe 100 in the cover member 122. For example, in FIG. 12, the opening is provided in a mounting portion of a pressure regulating valve 104. In this manner, since the atmospheric gas is pressed by the light element gas introduced from the gas inlet, to be discharged from the lower opening, the inside of the second casing 121 can be efficiently replaced with the gas. Note that, the opening may also serve as a rough evacuation port to be described later.

Further, even in case of light element gas such as helium gas, electron beam scattering is sometimes large. In this case, it is sufficient that the gas cylinder 103 is the vacuum pump. By vacuum-evacuating the second casing slightly, the inside of the second casing can be in a slightly vacuum state (that is, an atmosphere close to atmospheric pressure). For example, the second casing 121 or the cover member 122 is provided with a vacuum evacuation port, and the inside of the second casing 121 is vacuum-evacuated once. Thereafter, the replacement gas may be introduced. In vacuum evacuation of this case, since it is sufficient that atmospheric gas components remaining inside the second casing 121 are reduced to a certain amount or less, it is not necessary to perform high vacuum evacuation, and rough vacuum evacuation is sufficient.

However, when observing the sample containing water such as the biological sample, the state of the sample is changed by water evaporation in the sample which is placed in a vacuum state once. Therefore, it is preferred to observe the sample before complete evaporation of water or to introduce the replacement gas directly from the air atmosphere as described above. It is possible to effectively confine the replacement gas in the second space by closing the above opening with the cover member after introduction of the replacement gas.

Thus, in the present embodiment, it is possible to control the space in which the sample is placed, to any degree of vacuum from atmospheric pressure (about $10^5$ Pa) to about $10^3$ Pa. In a conventional so-called low vacuum scanning electron microscope, an electron beam column and a sample chamber are in communication with each other, and thus when reducing the degree of vacuum of the sample chamber to be close to atmospheric pressure, the pressure in the electron beam column is also changed in association with the pressure change in the sample chamber, and it has been difficult to control the sample chamber at pressure from atmospheric pressure (about $10^5$ Pa) to about $10^3$ Pa. According to the present embodiment, since the first space and the second space are separated from each other by the diaphragm, the gas type and the pressure of atmosphere in the second space surrounded by the second casing 121 and the cover member 122 can be freely controlled. Therefore, it is possible to control the sample chamber at pressure from atmospheric pressure (about $10^5$ Pa) to about $10^3$ Pa which has been difficult to be controlled. Further, in addition to the observation at atmospheric pressure (about $10^5$ Pa), it is possible to observe the state of the sample while continuously changing the pressure in the vicinity of atmospheric pressure.

In a case where a three-way valve is attached at a position of the opening, the opening can be used as both the rough evacuation port and an exhaust port for air leak. That is, when one port of the three-way valve is attached to the cover member 122, and another port is connected to a rough evacuation vacuum pump, and then the remaining one port is attached with a leak valve, the above-mentioned exhaust port having both functions can be implemented.

The pressure regulating valve 104 may be provided in place of the above-mentioned opening. The pressure regulating valve 104 has a function of automatically opening the valve when a pressure inside the second casing 121 is 1 atm or more. With the pressure regulating valve having such a function, during introduction of the light element gas, when the pressure inside the second casing 121 is 1 atm or more, the valve automatically opens to exhaust the atmospheric gas components such as nitrogen and oxygen to the outside of the device, so that the inside of the device can be filled with the light element gas. Note that, the gas cylinder or vacuum pump 103 shown in the drawing may be provided in the charged particle microscope or may be attached by the device user later.

On the sample stage 5 of the charged particle beam device, the sample base including the detection element 500 can be mounted. In a state where the above-mentioned sample base is placed on the sample stage, the detection element 500 is in a state of being placed on an opposite side of the diaphragm with respect to the sample. The arrangement and configuration of the photodetector 503 and the like in the vicinity of the sample stage are the same as FIG. 11. In case of the present configuration, it is possible to obtain a transmitted charged particle beam signal in which a shape change such as water evaporation generated by vacuum evacuation or the like is reduced to the minimum. Further, since it is not necessary to vacuum-evacuate a sample space to a high vacuum, it is possible to obtain the transmission charged particle microscope image of the sample on the sample base 600 with very high throughput.

<Description During Optical Microscope Observation>

Figure 13:
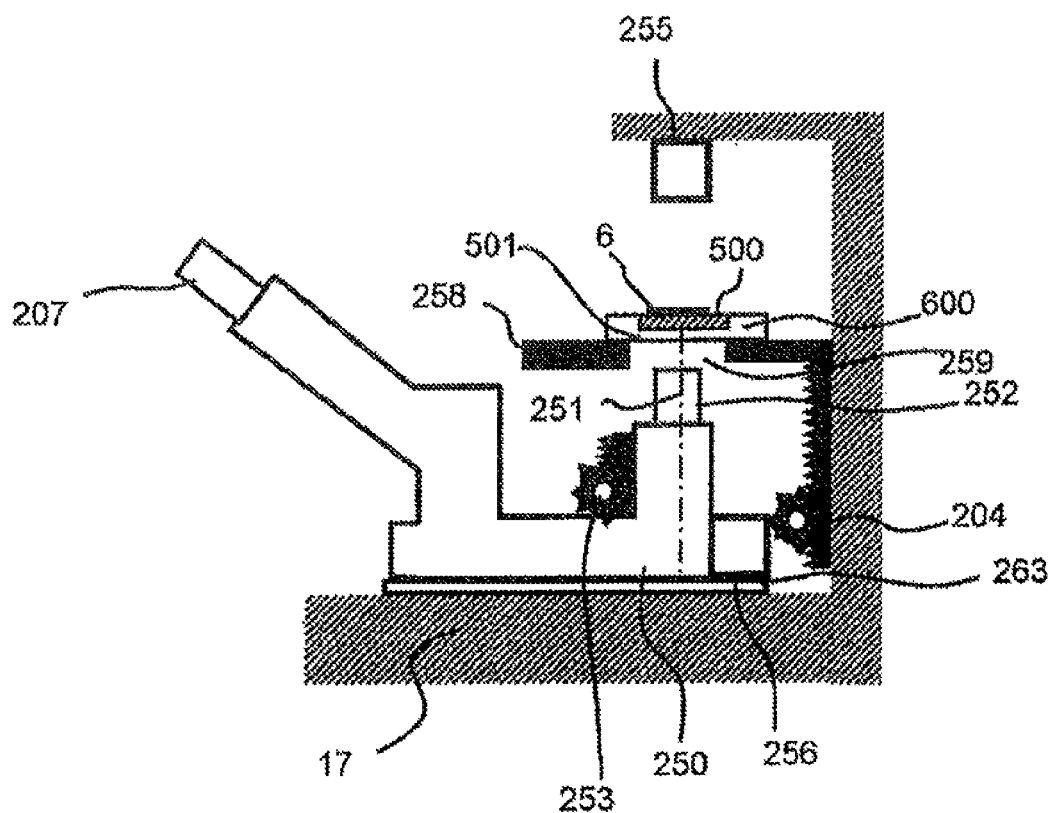
FIG. 13 is a configuration diagram for performing optical microscope observation in the embodiment 1.

FIG. 13 shows a case of the optical microscope observation. First, an optical microscope 250 will be described. The optical microscope 250 includes optical lenses such as an objective lens 252. Microscope information through the optical lenses is projected to an ocular lens 207. Or, the microscope information may be converted to digital signals by a CCD camera or the like, to be displayed on a monitor (not shown). The sample base 600 in the present embodiment is placed on a sample stage 258 including a drive mechanism 204 such as a XY drive mechanism capable of moving the sample stage 258 in a lateral direction with respect to an optical axis 251 of the optical microscope or in a direction perpendicular to a paper surface of the drawing, and a Z-axis drive mechanism capable of changing a distance with the objective lens 252. The sample base 600 of the present invention is placed on an opening 259 in the periphery of the optical axis 251 of the optical microscope on the sample stage 258. The optical microscope 250 includes a light source capable of emitting white light, ultraviolet light, wavelength-controlled light, and a photon beam such as a laser. The light source is, for example, a light source 255 for irradiating light from the upper side of the sample base 600, or a light source 256 for irradiating light from a lower side of the sample base 600 in the drawing. Note that, the light source may be sunlight, a light source of a room in which the optical microscope 250 is placed, or the like. Note that, by a communication line, an electric wire, and the like (not shown), power source for switching on and switching off the light is supplied and amount of light is controlled. In the drawing, the light sources are placed on the two positions described above, however at least one light source is sufficient. Hereinbefore, two light source positions are described as an example, however, they may be placed on another places. The optical microscope 250 has an optical lens drive mechanism 253 in order to change a focal position or an observation magnification of the sample 6 on the sample base. It is possible to focus on the sample 6 on the sample base 600 by moving the objective lens 252 in the optical axis 251 direction of the optical microscope by means of the optical lens drive mechanism 253. Further, although not shown, focus may be changed not by the objective lens 252 but by moving an optical lens inside the optical microscope 250 in the optical axis 251 direction.

Light which has been emitted from the light source 256 is released from the objective lens 251 or a periphery thereof via a mirror or the like inside the optical microscope 250, to reach the sample base 600. The photon beam, which has reached the sample base 600, passes through the transparent member 501 and the detection element 500, to reach the sample. A reflected light reflected from the sample again passes through the detection element 500 and the transparent member 501 to reach the objective lens 251. In this way, the optical signal irradiated on the objective lens 251 is imaged inside the optical microscope 251, and it is possible to perform the optical microscope observation of the sample by the ocular lens 207. Further, in a case where the light source is the light source 255, the light beam emitted from the light source 255 is irradiated on the sample at first. The light beam transmitted through the sample passes the detection element 500 and the transparent member 501, and it is possible to form the optical microscope image via the objective lens and the like.

Note that, the optical microscope described with reference to the drawing is an inverted optical microscope in which the optical lenses and the like are arranged on a lower side of the sample, however, it may be an upright optical microscope in which an optical system is arranged on the upper side of the sample. The light source may be anywhere also in this case.

Hereinbefore, devices and methods for observing the sample 6 on the sample base 600 in the present embodiment by means of the optical microscope have been described. As described above, since the detection element 500 and the transparent member 501 are transparent to the light from the light source, the optical microscope observation by transmitting the light through the sample and the sample base in this way is possible, and it is possible to obtain the charged particle microscope image in the atmosphere or in vacuum by means of the charged particle microscope device shown in FIG. 9 and FIG. 10.

Embodiment 2

Description of Basic Device Configuration

In the embodiment 1, using the same sample base 600 in both the charges particle microscope and the optical microscope, which are arranged individually, has been described. In the following, a compound microscope device configuration in which the optical microscope and the charged particle microscope are integrated will be described.

Figure 14:
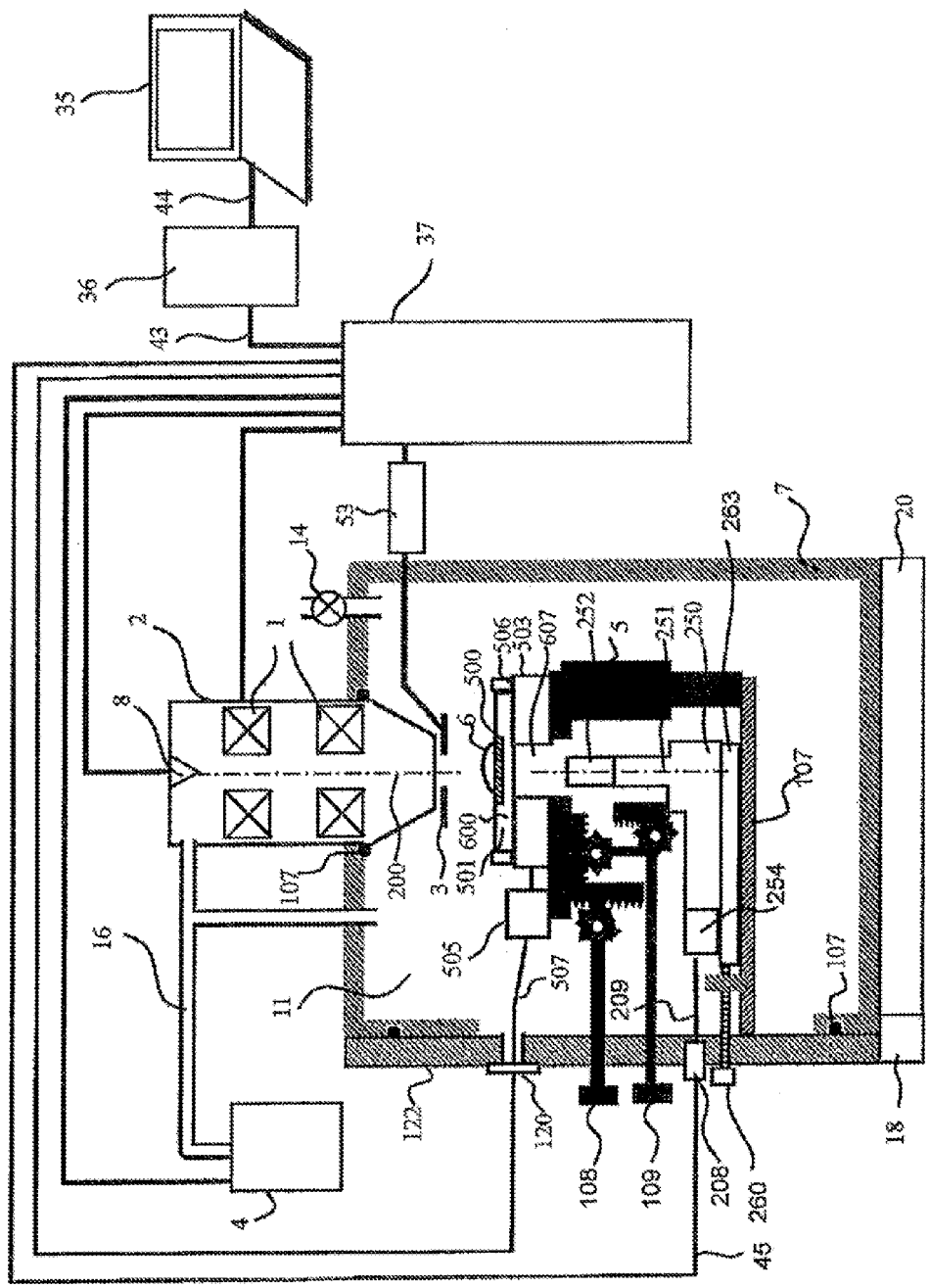
FIG. 14 is a configuration diagram of a composite device of the charged particle microscope and the optical microscope in an embodiment 2.

First, an outline of the present configuration will be described with reference to FIG. 14. Since operation and functions of each element or additional elements added to each element are substantially the same as the embodiment 1, detailed description thereof will be omitted.

In the present configuration, the optical microscope 250 is arranged inside the casing 7 of the charged particle microscope device. The optical microscope 250 forms the optical microscope image by infrared light, ultraviolet light, or visible light of a specific wavelength or all wavelength ranges which has passed through the transparent member of the sample base described above. The optical microscope 250 is arranged on the support plate 107 for supporting the sample stage 105, and is configured to observe the sample from the lower side of the sample base 600. In order to align positions observed by the optical microscope and the charged particle microscope, it is necessary to align an optical axis 200 of the charged particle optical column 2 and the optical axis 251 of the optical microscope 250 with each other. Therefore, the compound microscope device includes an optical axis adjusting mechanism 260 capable of changing a position of the optical microscope 250. Here, the drawing shows how the optical axis adjusting mechanism 260 is provided on the cover member 122. An operation unit of the optical axis adjusting mechanism 260 is provided on the cover member 122. The position of the optical microscope 250 is changed, for example, by turning the optical axis adjusting mechanism 260 so as to slide the optical microscope 250 on top of or on a side of a base 263 such as a guide or rail. The optical axis adjusting mechanism 260 is shown only one in the drawing, however, since it is also necessary to move the position of the optical microscope 250 in a direction perpendicular to a paper surface of the drawing, there may be the plurality of optical axis adjusting mechanisms 260.

Further, as another embodiment, although not shown, the optical axis adjusting mechanism 260 may be only inside the second casing. In this case, the position of the optical microscope 250 can be changed in a state where the cover member 122 is pulled out. With this configuration, since each optical axis can be aligned with each other, it is possible to observe the sample 6 by the charged particle optical column 2, as well as to obtain the optical microscope image of the same portion of the sample 6 by the optical microscope 250. Further, as shown in the drawing, since the sample stage 5 and the optical microscope 250 are arranged independently, the position of the optical microscope 250 is not changed even if the sample stage is moved.

In the present configuration, the microscope information via the optical lenses of the optical microscope is transmitted to a CCD camera 254 which is disposed inside the casing 7. The CCD camera 254 plays a role as a signal forming unit which converts the optical information to the digital signals such as electrical information. Image information, which has been converted to the electrical information by the CCD camera 254, is transmitted to the control unit and the like by using a communication line 209 and a communication line 45, to be displayed on the monitor. Of course, it may be an imaging device other than the CCD camera. Between the communication line 209 and the communication line 45, a wire connecting unit 208, which can transmit signals while separating the atmosphere between the casing 7 and the outside the device, is provided. An image capturing unit may be a direct observation using an ocular lens 254 as shown in FIG. 13.

Note that, the light source of the optical microscope may be provided in the optical microscope 250 as shown in FIG. 13, or may be arranged on the charged particle optical column 2 side.

With the charged particle microscope of the present configuration, it is possible to obtain a reflected charged particle microscope image by the detector 3, as well as to obtain the transmission charged particle microscope image by the detection element 500. The sample base 600 of the present embodiment is the same as FIG. 11 in that it is provided on the sample stage.

Figure 15A:
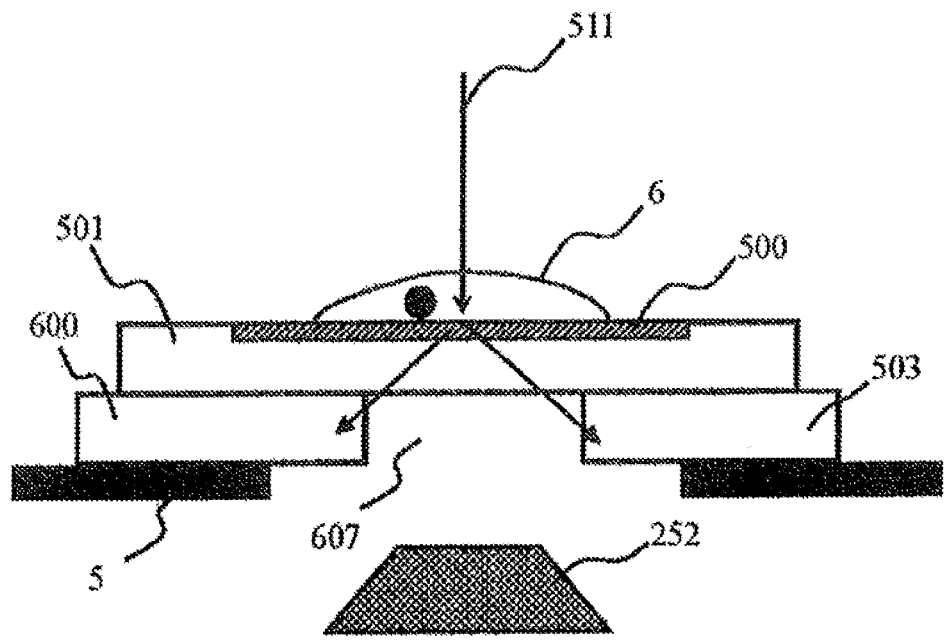
FIG. 15A is a diagram for describing detection of a transmitted charged particle beam from the detection element.

FIG. 15A shows a first configuration in the periphery of the sample base 600. In case of the present configuration, the photodetector 503 is configured to include an opening 607 in the center of the photodetector 503. With this configuration, the objective lens 252 of the optical microscope can be disposed at a position close to the sample base 600, and it is possible to observe at least a part of the sample 6 on the sample base 600, thereby performing the optical microscope observation from the lower side in the drawing. Further, it is possible to convert or amplify the optical signal, which has been generated by the transmitted charged particle beam from the sample 6 being irradiated on the photodetector 503, to the electrical signal by the photodetector 503 around the opening 607.

Figure 15B:
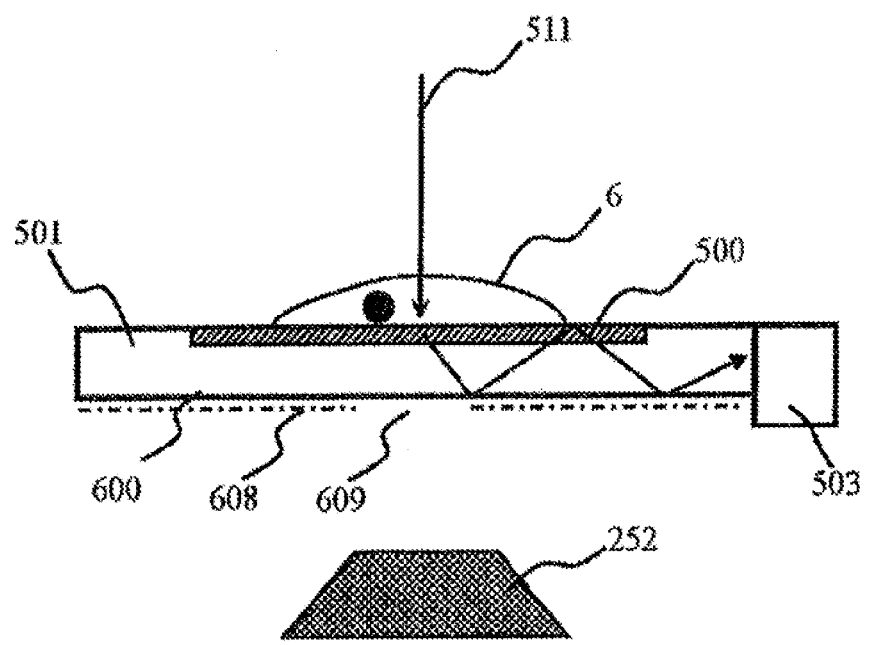
FIG. 15B is a diagram for describing detection of the transmitted charged particle beam from the detection element.

FIG. 15B shows a second configuration. In this case, the photodetector 503 is provided on a side of the sample base 600, and the light transmitted through the sample base 600 is detected from the side of the photodetector 503. In this case, since there is no photodetector between the sample base 600 and the optical microscope as shown in FIG. 15A, it is easy to obtain the optical microscope image of a wide field of view. Note that, although not shown, in order to efficiently collect the light from the side of the sample, it may be processed so that the light is reflected inside the sample base 600. For example, it is a process such as a light reflection process of forming surface roughness or attaching reflective materials on the upper surface, the lower surface, and the side surfaces of the sample base 600. For example, the light reflection process is performed on a portion indicated by a one-dot chain line 608 in FIG. 15B. However, an observation portion 609 where the light reflection process is not performed, for example, a portion to be observed by the optical microscope is also required.

By using such a configuration, it is possible to obtain both the charged particle transmission signal by the charged particle microscope device and the optical transmission signal by the optical microscope inside the same device. Further, it is possible to obtain both the optical microscope image and the charged particle microscope image of the same portion of the sample 6. By using the present configuration, it is possible to save the effort of loading the sample base 600 alternately in the optical microscope 250 and the charged particle microscope 601 as shown in FIG. 1, thereby observing the sample by the optical microscope 250 and the charged particle microscope 601 at a time.

Further, since the charged particle beam device of the present embodiment also includes the detector 3, it is possible to obtain the secondary charged particle generated or reflected from the sample by the detector 3, to obtain the transmitted charged particle scattered or transmitted through the sample by the detection element 500, and to obtain the optical microscope image by the optical microscope. It is possible to obtain these images at the same time, thereby switching the display on the monitor 35 among the secondary charged particle image, the transmitted charged particle image, and the optical microscope image by using the lower control unit 37 and the like. Further, it is also possible to display the three kinds of images at the same time.

Embodiment 3

Figure 16:
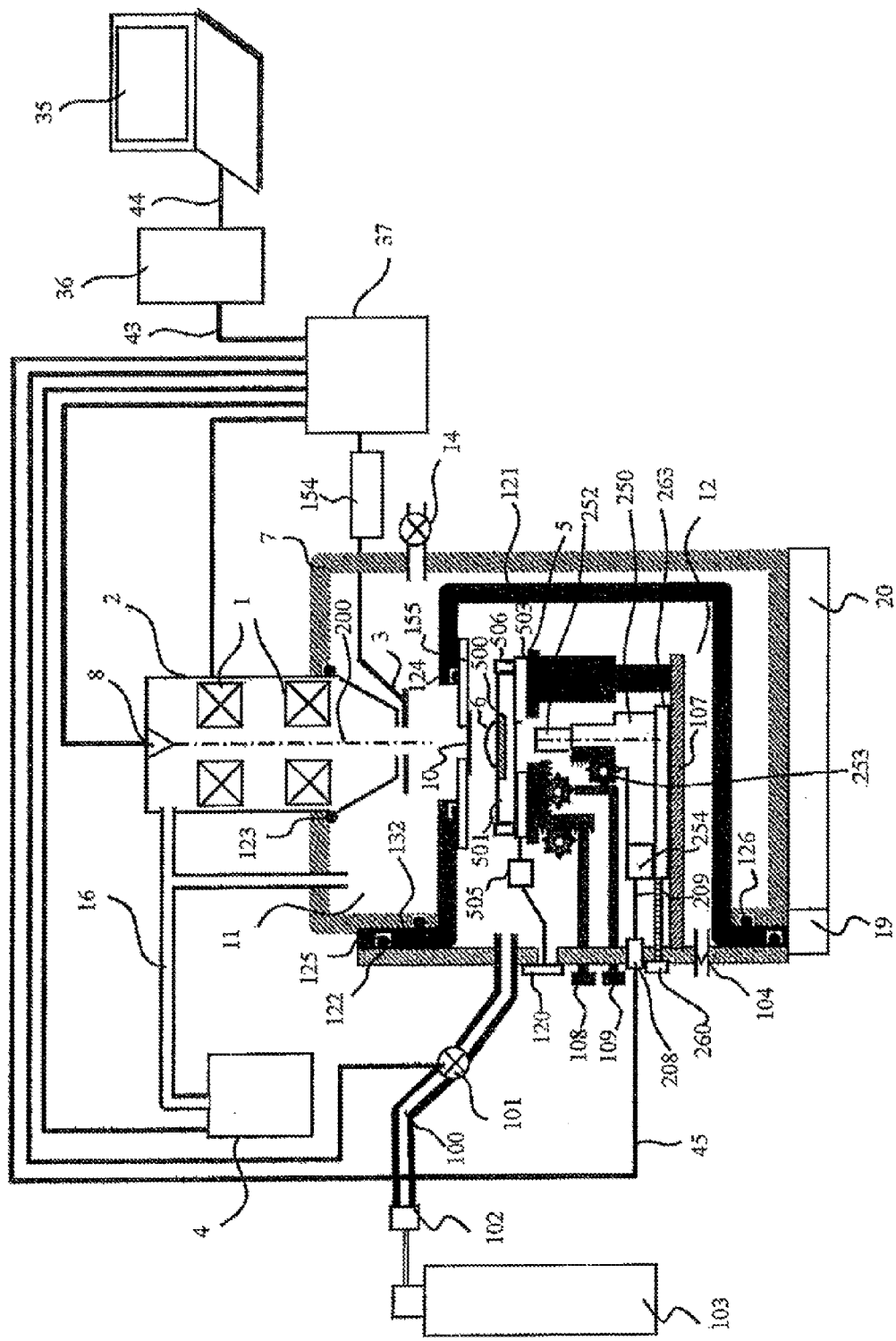
FIG. 16 is a configuration diagram of a composite device of the charged particle microscope and the optical microscope in an embodiment 3.

It is also possible to use the sample base of the present embodiment by integrating the optical microscope device and the charged particle microscope device capable of observing the sample at the atmospheric pressure. The present configuration is shown in FIG. 16. These devices have basically a device configuration in which FIG. 12 and FIG. 14 are combined, and redundant description will be omitted.

The present configuration is characterized in that the above-mentioned sample base is placed at the atmospheric pressure between the optical microscope 250 and the charged particle microscope device capable of observing the sample at the atmospheric pressure. The device configuration of the present embodiment is desirable when obtaining the optical microscope image and the transmission charged particle microscope image for the same portion of the sample containing a large amount of liquid.

With the device of the present embodiment, since it is not necessary to evacuate the sample space to a high vacuum, it is possible to load and unload the sample with very high throughput. Further, as described above, it is possible to make the inside of the second casing 7 be in a state of desired gas type or pressure, thereby observing the sample by the optical microscope and the transmission charged particle microscope in the desired gas.

Embodiment 4

The present embodiment is different from the embodiments described above, and an example where there is no second casing 121 will be described. Since the configuration of the periphery of the diaphragm 10, the sample stage 5, and the periphery of the optical microscope 250 is substantially the same as the embodiments 1 to 3 described above, differences will be mainly described in the following.

Figure 17:
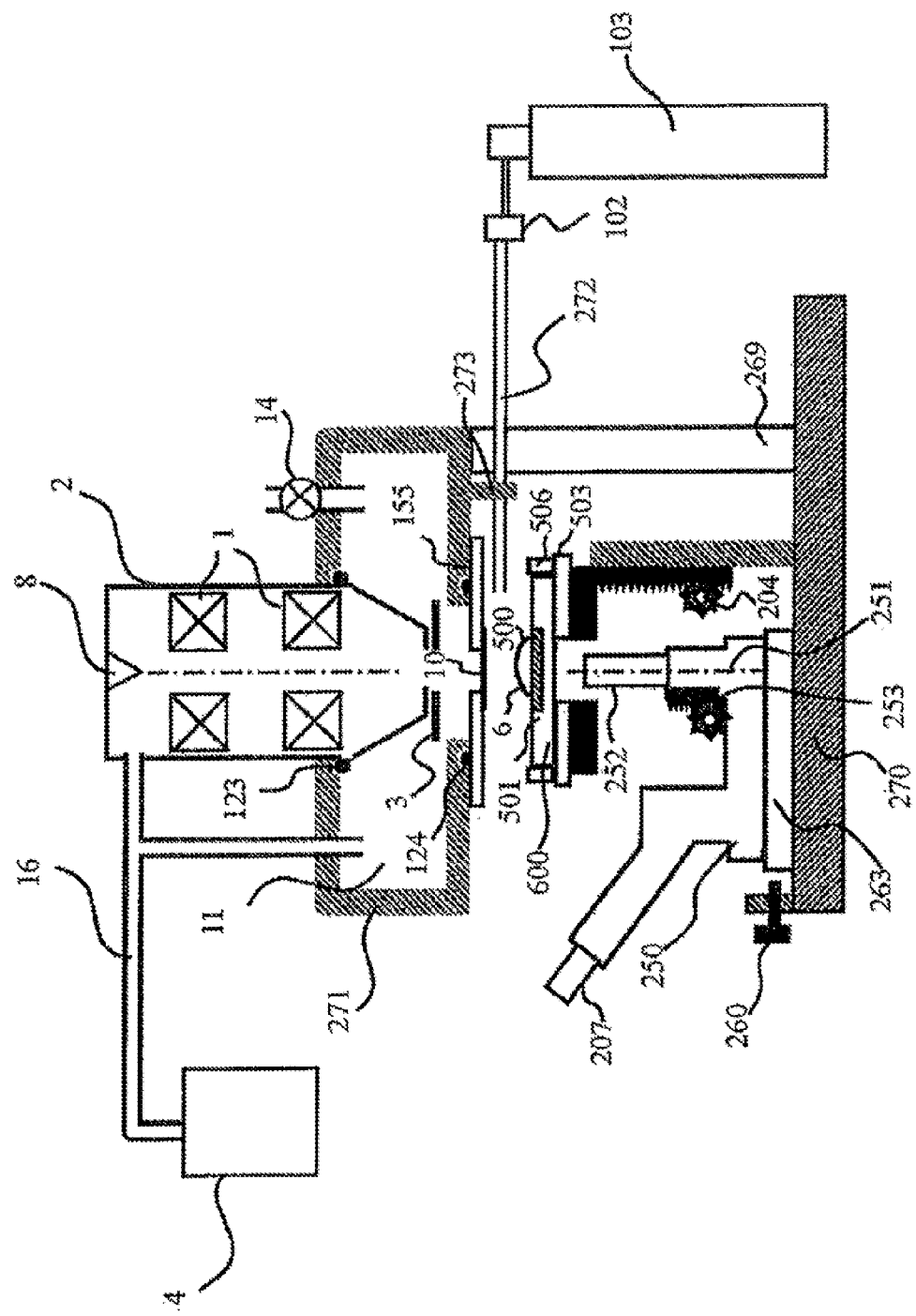
FIG. 17 is a configuration diagram of a composite device of the charged particle microscope and the optical microscope in an embodiment 4.

FIG. 17 shows an overall configuration of the charged particle microscope of the present embodiment. In the present embodiment, the charged particle optical column 2 is fitted into a casing 271, and is vacuum-sealed with the vacuum seal member 123. The casing 271 is supported by a pillar 269, and the pillar 269 is supported by a base 270. Although the pillar 269 is shown only one in the drawing, it is desirable that there is actually a plurality of pillars. With this configuration, since atmospheric conditions of the sample 6 are the same as the outside of the device, it is possible to expose the sample to the full atmospheric conditions.

Gas supply from the gas cylinder 103 is performed through a gas nozzle 272 facing toward a direction of the vicinity of the sample 6. The gas nozzle 272 is connected to the casing 271, for example, by a support 273. The gas cylinder 103 and the gas nozzle 272 are connected to each other through the connecting portion 102. The configuration is an example, and it is possible to spray the desired gas to the vicinity of the sample 6 by the present configuration. As the gas type, nitrogen, water vapor, helium gas, hydrogen gas or the like, which is lighter than air, is used so that electron beam scattering can be reduced. The gas can be freely replaced by the user. Further, the gas cylinder 103 may be replaced with the vacuum pump in order to vacuum-evacuate a space between the sample 6 and the diaphragm 10.

The optical microscope 250 is arranged directly under the casing 271, or coaxially with the optical axis of the charged particle optical column. Thus, it is possible to obtain the optical microscope image by the optical microscope 250, as well as to obtain the charged particle microscope image by irradiating the sample 6 on the sample base 600 placed on the sample stage 5 with the charged particle beam passing through the diaphragm 10. The configuration such as the optical axis adjusting mechanism 260 and the optical lens drive mechanism 253 for driving inner lenses of the optical microscope in the optical axis 251 direction of the optical microscope 250 is the same as that shown in the embodiments described above.

With the configuration of the present embodiment, it is possible to observe the same portion by the optical microscope and the charged particle microscope in a state where the diaphragm 10, the sample 6, and the optical microscope 250 are in non-contact with one another.

In case of the present configuration, since there is no limit to a sample placement space, it is useful when the size of the sample base 600 is very large.

Embodiment 5

Next, an embodiment in which the optical microscope and the charged particle microscope device capable of observing the sample at the atmospheric pressure are integrated will be described. In the present embodiment, the configuration in which the charged particle optical column 2 of the embodiment described above is under the diaphragm 10 will be described.

Figure 18:
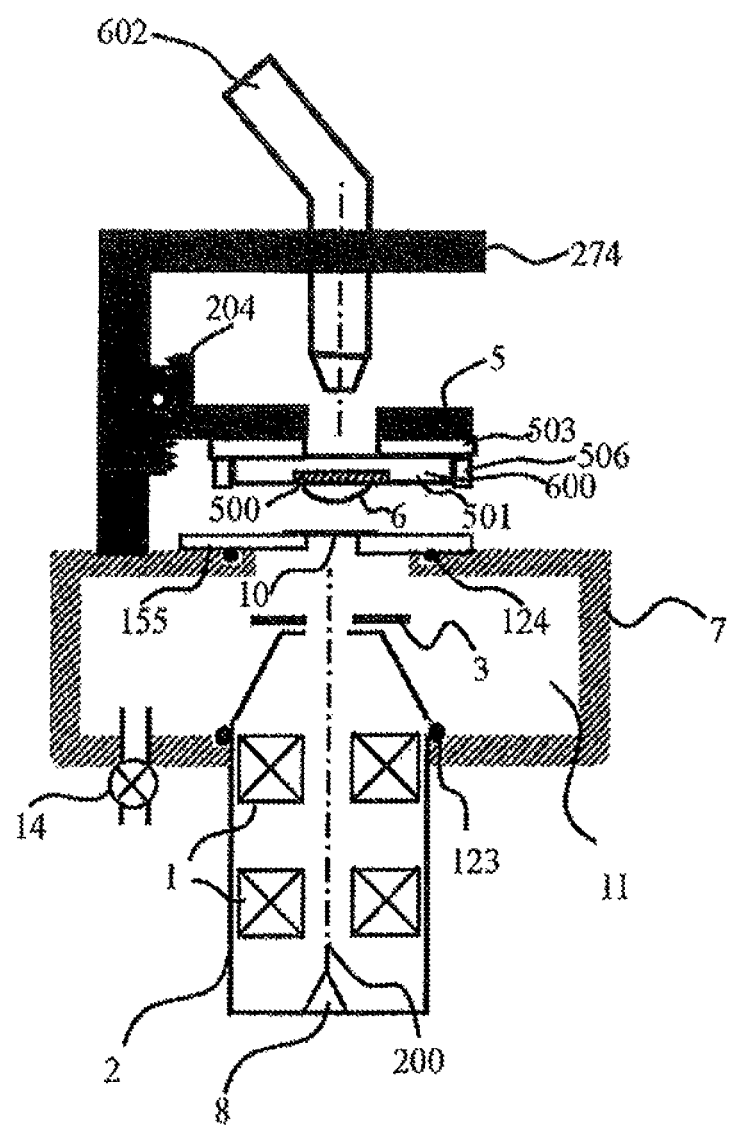
FIG. 18 is a configuration diagram of a composite device of the charged particle microscope and the optical microscope in an embodiment 5.

FIG. 18 shows a configuration diagram of the charged particle microscope of the present embodiment. It is shown by omitting the vacuum pump, the control system, and the like. Further, the charged particle optical column 2 and the casing 7 which is the vacuum chamber are assumed to be supported by the pillar, the support, or the like with respect to the device installation surface. Since operation and functions of each element or additional elements added to each element are substantially the same as the embodiments described above, a detailed description thereof will be omitted.

The sample stage 5 is provided on the casing or the diaphragm holding member so that the diaphragm 10 and the sample 6 mounted on the sample base 600 can be in non-contact with each other. That is, the charged particle beam is assumed to be irradiated on a lower part of the sample 6 in the drawing. By using an operation unit 204 for operating the sample stage 5, it is possible to allow a lower surface of the sample in the drawing to approach the diaphragm 10.

Further, the optical microscope 602 is arranged on the upper side of the sample base 600 and the charged particle optical column 2, and is arranged coaxially with the optical axis of the charged particle optical column. Thus, it is possible to obtain the optical microscope image by the optical microscope 602 from the upper side in the drawing, as well as to obtain the charged particle microscope image by irradiating the sample 6 on the sample base 600 placed on the sample stage 5 with the charged particle beam passing through the diaphragm 10.

Note that, the present invention is not limited to the embodiments described above, but various modifications are included therein. For example, the embodiments described above are those described in detail in order to better describe the present invention, and the present invention is not necessarily limited to those which include all the configurations described above. Further, it is possible to replace a part of configuration of an embodiment with a configuration of another embodiment, and it is also possible to add a configuration of another embodiment to a configuration of an embodiment. Further, a part of configuration of each embodiment can be added, deleted, or replaced with another configuration. Further, a part of or all of each configuration, function, processing unit, processing means or the like described above may be implemented in hardware, for example, by designing an integrated circuit. Furthermore, each configuration, function or the like described above may be implemented by software by interpreting and executing a program for implementing each function by a processor.

Information of program, table, file and the like for implementing each function can be stored in recording devices such as a memory, a hard disk, an SSD (Solid State Drive), or in recording media such as an IC card, an SD card, an optical disk.

Further, control lines and information lines are shown what is considered to be necessary for description, and all of the control lines and information lines on a product is not necessarily shown. In fact, almost all of components may be considered to be connected to one another.

REFERENCE SIGNS LIST

1: optical lens
2: charged particle optical column
3: detector
4: vacuum pump
5: sample stage
6: sample
7: casing
8: charged particle source
10: diaphragm
11: first space
12: second space
14: leak valve
15: open surface
16: vacuum pipe
17: stage support base
18: support pillar
19: support member for cover member
20: bottom plate
35: computer
36: upper control unit
37: lower control unit
43, 44, 45: communication line
100: gas supply pipe
101: gas control valve
102: connecting portion
103: gas cylinder or vacuum pump
104: pressure regulating valve
107: support plate
108: operating knob
109: operating knob
121: second casing
122: cover member
123, 124, 125, 126, 128, 129: vacuum seal member
154: signal amplifier
155: holding member
156, 157, 158: signal line
159: diaphragm holding base
200: optical axis of charged particle beam
204: drive mechanism
207: ocular lens
208: wire connecting unit 209: communication line
250: optical microscope
251: optical axis of optical microscope
252: objective lens
253: optical lens drive mechanism
254: CCD camera
255, 256, 257: light source
258: sample stage
259: opening
260: optical axis adjusting mechanism
263: base, rail, or guide
267: fine particle sample
268: connecting portion
269: pillar
270: base
271: casing
272: nozzle
273: support
274: support
500: detection element
501: transparent member
502: thin film
503: photodetector
504: side wall
505: preamplifier board
506: projection
507: wire
508: high density portion
509: low density portion
510: primary charged particle beam
511: primary charged particle beam
600: sample base
601: charged particle microscope
602: optical microscope
603: light source
604: charged particle beam detector
606: optical axis of optical microscope
607: opening
608: light reflecting portion
609: observation portion
700: vessel
701: culture medium

The invention claimed is:

1. A sample base, which is mounted with a sample to be observed by irradiating a charged particle beam, comprising
a light-emitting member that converts electrical energy to visible light and which forms at least a portion of the sample base, and emits light by charged particles transmitted through or scattered inside the sample,
wherein the sample is placed directly or via a predetermined member on the light-emitting member, and
wherein infrared light, ultraviolet light, or visible light of a specific or all wavelength ranges can pass through at least between a portion on which the sample is placed and a surface opposite to the portion on which the sample is placed in the sample base.

2. The sample base according to claim 1,
wherein the sample base can be used as a sample base for a transmission optical microscope.

3. The sample base according to claim 2,
wherein the sample can be observed by the transmission optical microscope while being placed on the sample base.

4. The sample base according to claim 1,
wherein the sample base is provided with a base for supporting the light-emitting member, and
wherein infrared light, ultraviolet light, or visible light of a specific or all wavelength ranges can pass through the base.

5. The sample base according to claim 4,
wherein the sample base has a side wall on a peripheral edge portion of the base.

6. The sample base according to claim 4,
wherein the portion on which the sample is placed and a surface of the base on which the sample is mounted are at the same height.

7. The sample base according to claim 4,
wherein all of a surface of the base on which the sample is mounted is the light-emitting member.

8. The sample base according to claim 4,
wherein a plurality of light-emitting members are arranged on the base.

9. The sample base according to claim 4,
wherein a distance between a surface of the light-emitting member on which the sample is placed and a surface of the base on which the sample is mounted is equal to several hundred micrometers or less.

10. The sample base according to claim 4,
wherein the light-emitting member has the same thickness as that of the base.

11. The sample base according to claim 4,
wherein there is a portion on which information of the sample can be written on the base or the light-emitting member.

12. The sample base according to claim 1,
wherein the predetermined member is provided between the sample and the light-emitting member, and has a thickness through which at least a part of the charged particle beam can be transmitted.

13. The sample base according to claim 1, further comprising:
two cylindrical vessels having openings on upper and lower sides thereof, the two cylindrical vessels being in direct contact with the sample base, wherein
a thickness of the sample base in a region closest to the light-emitting element is one half of a thickness at distal ends of the sample base in regions farthest from the light-emitting element.

14. A charged particle beam device comprising:
a charged particle optical column for irradiating a sample with a primary charged particle beam;
a vacuum pump for vacuum-evacuating an inside of the charged particle optical column;
a sample base that is in direct contact with the light-emitting member, the light-emitting member being detachable from the sample base; and
a light conversion detector for converting emitted light, which passes through at least between a portion on which the sample is placed and a surface opposite to the portion on which the sample is placed in the sample base, from the light-emitting member to an electrical signal.

15. The charged particle beam device according to claim 14, further comprising
a detachable diaphragm which is disposed such that a space where the sample is mounted and the charged particle optical column are spaced from each other, and allows the primary charged particle beam to be transmitted or pass therethrough,
wherein the sample and the sample base including the light-emitting member are maintained in an atmosphere of pressure condition different from inside the charged particle optical column, and wherein the light-emitting member is mounted on an opposite side of the diaphragm with respect to the sample.

16. The charged particle beam device according to claim 14, further comprising an optical microscope which is arranged coaxially with the charged particle optical column, and forms an optical microscope image by infrared light, ultraviolet light, or visible light of a specific wavelength or all wavelength ranges passing through at least between the portion on which the sample is placed and the surface opposite to the portion on which the sample is placed in the sample base.

17. A sample observation method for observing a sample by irradiating a charged particle beam in a charged particle microscope, comprising following steps:

a step of irradiating the charged particle beam to the sample placed directly on a light-emitting member that is in direct contact with and that forms at least a part of a sample base and emits light by charged particles passed through or scattered inside the sample;

a step of obtaining a charged particle microscope image by detecting emitted light of the light-emitting member; and a step of obtaining an optical microscope image by an optical microscope while the sample is placed on the sample base.

* * * * *